(12) United States Patent
Kagawa et al.

(10) Patent No.: US 9,379,006 B2
(45) Date of Patent: *Jun. 28, 2016

(54) SEMICONDUCTOR APPARATUS, ELECTRONIC DEVICE, AND METHOD OF MANUFACTURING SEMICONDUCTOR APPARATUS

(71) Applicant: Sony Corporation, Tokyo (JP)

(72) Inventors: Yoshihisa Kagawa, Kanagawa (JP); Naoki Komai, Kanagawa (JP)

(73) Assignee: Sony Corporation, Tokyo (JP)

( * ) Notice: Subject to any disclaimer, the term of this patent is extended or adjusted under 35 U.S.C. 154(b) by 65 days.

This patent is subject to a terminal disclaimer.

(21) Appl. No.: 14/162,140

(22) Filed: Jan. 23, 2014

(65) Prior Publication Data

US 2014/0131874 A1 May 15, 2014

Related U.S. Application Data

(63) Continuation of application No. 13/416,412, filed on Sep. 9, 2012, now Pat. No. 8,664,763.

(30) Foreign Application Priority Data

Mar. 24, 2011 (JP) .................................. 2011-066256

(51) Int. Cl.
*H01L 21/768* (2006.01)
*H01L 23/532* (2006.01)
*H01L 23/00* (2006.01)

(52) U.S. Cl.
CPC .... *H01L 21/76838* (2013.01); *H01L 23/53209* (2013.01); *H01L 24/03* (2013.01); *H01L 24/05* (2013.01); *H01L 24/08* (2013.01); *H01L 24/80* (2013.01); *H01L 24/94* (2013.01); *H01L 2224/0345* (2013.01); *H01L 2224/03462* (2013.01); *H01L 2224/03505* (2013.01); *H01L 2224/03616* (2013.01); *H01L 2224/05166* (2013.01); *H01L 2224/05181* (2013.01); *H01L 2224/05186* (2013.01); *H01L 2224/05546* (2013.01); *H01L 2224/05547* (2013.01); *H01L 2224/05571* (2013.01); *H01L 2224/05647* (2013.01); *H01L 2224/08147* (2013.01); *H01L 2224/0903* (2013.01); *H01L 2224/45147* (2013.01); *H01L 2224/48847* (2013.01); *H01L 2224/80004* (2013.01);

(Continued)

(58) Field of Classification Search
CPC ............ H01L 21/768; H01L 21/76838; H01L 23/532; H01L 23/53209
See application file for complete search history.

(56) References Cited

U.S. PATENT DOCUMENTS 8,431,436 B1 * 4/2013 Nguyen ........................ 438/107
2003/0160330 A1 8/2003 McTeer (Continued)

FOREIGN PATENT DOCUMENTS

JP 2007-234725 9/2007

*Primary Examiner* — Peniel M Gumedzoe

(74) *Attorney, Agent, or Firm* — Michael Best & Friedrich LLP

(57) ABSTRACT

A semiconductor apparatus, electronic device, and method of manufacturing the semiconductor apparatus are disclosed. In one example, the semiconductor apparatus comprises a first semiconductor part that includes a first wiring, and a second semiconductor part that is adhered to the first semiconductor part and which includes a second wiring electrically connected to the first wiring. A metallic oxide is formed in at least one of the first wiring and the second wiring.

18 Claims, 19 Drawing Sheets

(52) U.S. Cl.
CPC .......... *H01L 2224/8009* (2013.01); *H01L 2224/80011* (2013.01); *H01L 2224/80075* (2013.01); *H01L 2224/80092* (2013.01); *H01L 2224/80357* (2013.01); *H01L 2224/80895* (2013.01); *H01L 2224/80896* (2013.01); *H01L 2225/06541* (2013.01); *H01L 2924/00014* (2013.01); *H01L 2924/01012* (2013.01); *H01L 2924/01015* (2013.01); *H01L 2924/01029* (2013.01); *H01L 2924/12043* (2013.01); *H01L 2924/13091* (2013.01); *H01L 2924/1434* (2013.01)

(56) References Cited

U.S. PATENT DOCUMENTS

| | | | |
|---|---|---|---|
| 2007/0145600 A1* | 6/2007 | Yano et al. .................. | 257/774 |
| 2008/0265399 A1 | 10/2008 | Chao | |
| 2011/0084403 A1* | 4/2011 | Yang ..................... | H01L 24/03 257/777 |
| 2011/0162874 A1* | 7/2011 | Nguyen et al. ............. | 174/257 |
| 2012/0061838 A1* | 3/2012 | Edelstein et al. ........... | 257/751 |
| 2012/0273949 A1* | 11/2012 | Liu et al. .................... | 257/751 |

\* cited by examiner

F I G . 1
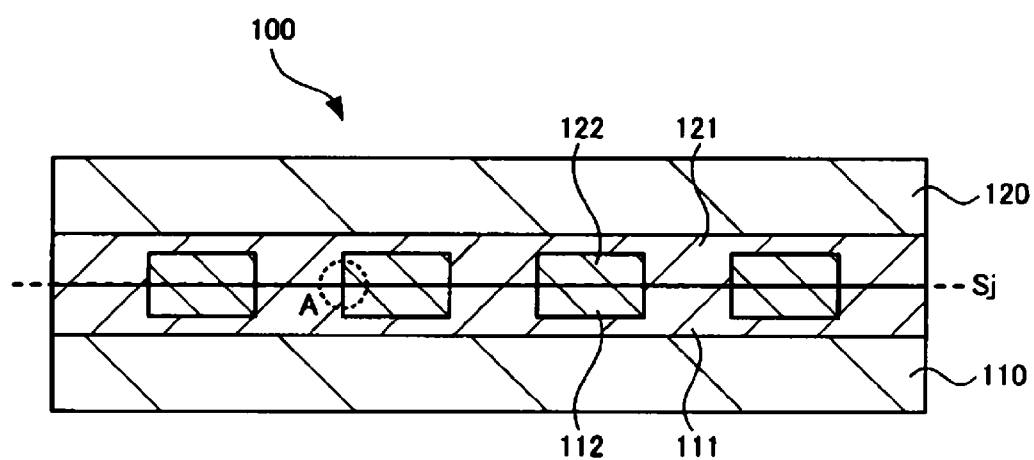

CONNECTION TO
SOLID-STATE IMAGING DEVICE 412

CONNECTION TO LOGIC CIRCUIT 423

CONNECTION TO LOGIC CIRCUIT 423

CONNECTION TO
SOLID-STATE IMAGING DEVICE 412

SEMICONDUCTOR APPARATUS, ELECTRONIC DEVICE, AND METHOD OF MANUFACTURING SEMICONDUCTOR APPARATUS

The present application is a Continuation of application Ser. No. 13/416,412, filed on Mar. 9, 2012, and contains subject matter related to Japanese Priority Patent Application JP 2011-066256 filed in the Japan Patent Office on Mar. 24, 2011, the entire content of which is hereby incorporated by reference.

BACKGROUND

The present disclosure relates to a semiconductor apparatus, an electronic device, and a method of manufacturing a semiconductor apparatus. More particularly, the present disclosure relates to a semiconductor apparatus, an electronic device, and a method of manufacturing a semiconductor apparatus in which joining of wirings is conducted by adhering two substrates to each other during manufacture.

A technology has been developed in which two wafers (substrates) are adhered to each other to join copper wirings formed on the wafers to each other (the joining will hereafter be referred to as "Cu—Cu joining (or Cu—Cu joint)"). In such a joining technique, the joint surfaces (Cu surfaces) of the wafers are, before joining, subjected to a reducing treatment such as chemical liquid cleaning (wet etching) or dry etching so as to remove oxygen (oxides) from the Cu surfaces, thereby exposing clean Cu surfaces (refer, for example, to Japanese Patent Laid-open No. 2007-234725, hereinafter referred to as Patent Document 1).

Patent Document 1 proposes a technology for manufacturing a solid-state imaging device wherein a semiconductor layer in which a solid-state imaging device is formed and a semiconductor layer in which a logic circuit for controlling the solid-state imaging device is formed are adhered to each other. FIGS. 15A to 15D illustrate the procedure of the solid-state imaging device manufacturing technique proposed in Patent Document 1. In addition, FIGS. 16A to 16C show the procedure of Cu—Cu joining technique carried out in adhering the two semiconductor layers to each other in the technology proposed in Patent Document 1.

In the adhering technique described in Patent Document 1, first, an SOI (silicon on insulator) substrate 410 provided with a first semiconductor layer 411 is prepared. In Patent Document 1, next, a solid-state imaging device 412 is formed in the first semiconductor layer 411, as shown in FIG. 15A. In this case, as shown in FIG. 16A, a first interlayer dielectric 413 is formed so as to cover the solid-state imaging device 412, and, further, first electrodes 414 made, for example, of copper for leading out the electrodes of the solid-state imaging device 412 is formed in the first interlayer dielectric 413.

In addition, in Patent Document 1, as shown in FIG. 15B, a logic circuit 423 for controlling the solid-state imaging device 412 is formed in a second semiconductor layer 421 different from the first semiconductor layer 411 in crystal orientation. In this instance, as shown in FIG. 16B, a second interlayer dielectric 422 is formed so as to cover the logic circuit 423, and second electrodes 424 made, for example, of copper for leading out the electrodes of the logic circuit 423 are formed in the second interlayer dielectric 422.

Subsequently, according to Patent Document 1, the first semiconductor layer 411 and the second semiconductor layer 421 are adhered to each other as shown in FIG. 15C. In this case, first, the surface of the first semiconductor layer 411 on the first interlayer dielectric 413 side (the joint surfaces of the first electrodes 414) and the surface of the second semiconductor layer 421 on the second interlayer dielectric 422 side (the joint surfaces of the second electrodes 424) are cleaned, for example, with diluted hydrofluoric acid, so as to remove oxides from the electrode surfaces. Next, as shown in FIG. 16C, alignment is carried out so that the first electrodes 414 and the second electrodes 424 face each other, followed by adhering the first semiconductor layer 411 and the second semiconductor layer 421 to each other.

Then, with the first semiconductor layer 411 and the second semiconductor layer 421 kept adhered to each other, a pressing and heating treatment is carried out, to join the first electrodes 414 and the second electrodes 424 to each other. Thereafter, that portion of the SOI substrate 410 which is on the side opposite to the first semiconductor layer 411 side is removed, to expose the solid-state imaging device 412 as shown in FIG. 15D. According to Patent Document 1, the first semiconductor layer 411 and the second semiconductor layer 421 are adhered to each other (Cu—Cu joining between the first electrodes 414 and the second electrodes 424 is carried out) in the above-mentioned manner, thereby manufacturing the solid-state imaging apparatus.

SUMMARY

As above-mentioned, in relation to a manufacturing process of a semiconductor apparatus, for example, a solid-state imaging apparatus, there has been proposed a technology in which two wafers are adhered to each other and Cu—Cu joining is effected. In this technical field, however, there is still a request for development of a semiconductor apparatus in which generation of such problems as defects in continuity at a Cu—Cu joint interface and a rise in wiring resistance is restrained and which has a highly reliable Cu—Cu joint interface.

Thus, there is a need for a semiconductor apparatus having a highly reliable Cu—Cu joint interface, an electronic device having a highly reliable Cu—Cu joint interface, and a method of manufacturing a semiconductor apparatus having a highly reliable Cu—Cu joint interface.

Accordingly, a semiconductor apparatus, electronic device, and method of manufacturing the semiconductor apparatus are disclosed. In one example, the semiconductor apparatus comprises a first semiconductor part that includes a first wiring, and a second semiconductor part that is adhered to the first semiconductor part and which includes a second wiring electrically connected to the first wiring. A metallic oxide is formed in at least one of the first wiring and the second wiring.

According to another embodiment of the present disclosure, there is provided a semiconductor apparatus including:
a first semiconductor part including a first wiring;
a second semiconductor part which is adhered to the first semiconductor part and which includes a second wiring electrically connected to the first wiring; and
a metallic oxide formed by a reaction between oxygen and a metallic material which reacts with oxygen more easily than hydrogen does, the metallic oxide having been diffused into a region which includes a joint interface between the first wiring and the second wiring and the inside of at least one of the first wiring and the second wiring.

In addition, according to another embodiment of the present disclosure, there is provided an electronic device including:

a first wiring part including a first wiring;
a second wiring part which is in the state of being adhered to the first wiring part and which includes a second wiring electrically connected to the first wiring; and
a metallic oxide formed by a reaction between oxygen and a metallic material which reacts with oxygen more easily than hydrogen does, the metallic oxide having been diffused into a region which includes a joint interface between the first wiring and the second wiring and the inside of at least one of the first wiring and the second wiring.

Furthermore, according to a further embodiment of the present disclosure, there is provided a method of manufacturing a semiconductor apparatus which has a first semiconductor part including a first wiring and a second semiconductor part including a second wiring, the method including:
diffusing a metallic material which reacts with oxygen more easily than hydrogen does, into the inside of at least one of the first wiring and the second wiring;
adhering the first semiconductor part and the second semiconductor part to each other so that the first wiring and the second wiring are electrically connected to each other; and
heating the first semiconductor part and the second semiconductor part, in the adhered state, so as to cause the metallic material and the oxygen to react with each other.

As above-mentioned, in the semiconductor apparatus (electronic device) and the manufacturing method therefor according to embodiments of the present disclosure, the metallic material which reacts with oxygen more easily than hydrogen does is preliminarily diffused into the inside of at least one of the first wiring and the second wiring. This results in that when the first semiconductor part and the second semiconductor part are adhered to each other, oxygen present in the vicinity of the joint interface between the first wiring and the second wiring reacts with the metallic material, whereby generation of voids is restrained. According to embodiments of the present disclosure, therefore, a semiconductor apparatus (electronic device) having a highly reliable joint interface between a first wiring and a second wiring and a manufacturing method therefor can be provided.

BRIEF DESCRIPTION OF THE DRAWINGS

FIG. 1 illustrates a problem generated in a Cu—Cu joining treatment;

DETAILED DESCRIPTION OF THE PREFERRED EMBODIMENTS

Figure 2A:
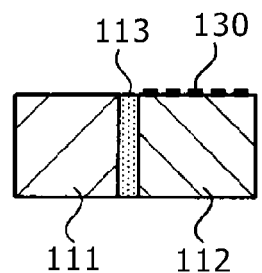
FIGS. 2A to 2D illustrate a problem generated in a Cu—Cu joining treatment.

Now, examples of a semiconductor apparatus and a manufacturing technique therefor according to embodiments of the present disclosure will be described below, referring to the drawings and in the following order. It is to be noted, however, that the present disclosure is not restricted to the following examples.
1. Outline of Cu—Cu Joining Technique
2. First Embodiment
3. Second Embodiment
4. Third Embodiment
5. Fourth Embodiment
6. Various Modifications
7. Various Application Examples 1. Outline of Cu—Cu Joining Technique

[Problems Involved in Cu—Cu Joining Technique According to Related Art]

First, before describing a Cu—Cu joining technique according to an embodiment of the present disclosure, the problems which may be generated in Cu—Cu joining techniques according to the related art will be described, referring to FIG. 1 and FIGS. 2A to 2D.

Incidentally, FIG. 1 is a schematic sectional view of the vicinity of a Cu—Cu joint interface in a semiconductor apparatus fabricated by adhering two substrates to each other. FIGS. 2A to 2D illustrate the treatment procedure in the Cu—Cu joining technique according to the related art. It is to be noted here that in FIGS. 2A to 2D, for simplification of description, only a part of a Cu—Cu joint interface (for instance, the region surrounded by broken line A in FIG. 1) is shown in an enlarged form.

A semiconductor apparatus 100 shown in FIG. 1 includes a first substrate 110 (in FIG. 1, the substrate on the lower side), a first $SiO_2$ layer 111 (dielectric), and a first Cu wiring 112. Further, the semiconductor apparatus 100 includes a second substrate 120 (in FIG. 1, the substrate on the upper side), a second SiO₂ layer 121, and a second Cu wiring 122. Though not shown in FIG. 1, a Cu barrier layer (each of a first Cu barrier layer 113 and a second Cu barrier layer 123 in FIGS. 2A to 2D) is formed at the interface between each SiO₂ layer and each Cu wiring.

In the semiconductor apparatus 100 shown in FIG. 1, the first Cu wiring 112 is formed on the surface on one side of the first substrate 110 by way of the first SiO₂ layer 111 therebetween, and the second Cu wiring 122 is formed on the surface on one side of the second substrate 120 by way of the second SiO₂ layer 121 therebetween. In the example shown in FIG. 1, the first Cu wiring 112 and the second Cu wiring 122 are disposed to face each other, and, in this condition, the first substrate 110 and the second substrate 120 are adhered to each other, to fabricate the semiconductor apparatus 100.

Now, problems which may be generated in performing the Cu—Cu joining in fabricating the semiconductor apparatus 100 shown in FIG. 1 will be specifically described, referring to FIGS. 2A to 2D.

First, normally, prior to adhesion of the first substrate 110 and the second substrate 120 to each other, the joint-side surfaces of the Cu wirings are subjected to a reducing treatment, such as chemical liquid cleaning (wet etching) or dry etching, to remove oxygen (oxides) from the joint-side surfaces of the Cu wirings. The state of the vicinity of the joint-side surface of each Cu wiring after the reducing treatment is illustrated in FIG. 2A.

Even if the joint-side surface of the first Cu wiring 112 is subjected to the above-mentioned reducing treatment, it is practically difficult to completely remove oxygen 130 from the joint-side surface of the first Cu wiring 112. Therefore, the joint-side surface of the first Cu wiring 112 after the reducing treatment is in a state wherein some oxygen 130 is left, as shown in FIG. 2A. Also, even if the joint-side surface of the second Cu wiring 122 is subjected to the above-mentioned reducing treatment, some oxygen 130 is similarly left on the joint-side surface of the second Cu wiring 122.

Figure 2B:
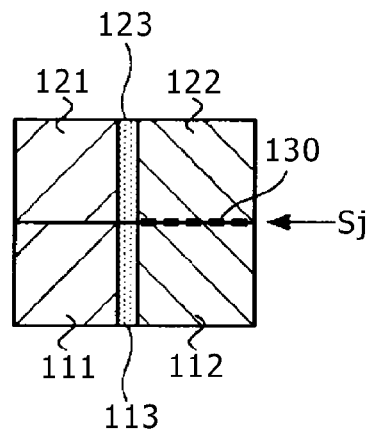

Next, in the condition where oxygen 130 is left on the joint-side surfaces of the Cu wirings, the first substrate 110 and the second substrate 120 are adhered to each other, resulting in that the oxygen 130 is left at a joint interface (joint surface) Sj between the first Cu wiring 112 and the second Cu wiring 122, as shown in FIG. 2B. The oxygen 130 thus remaining at the joint interface Sj constitutes one of the causes of void formation.

Figure 2C:
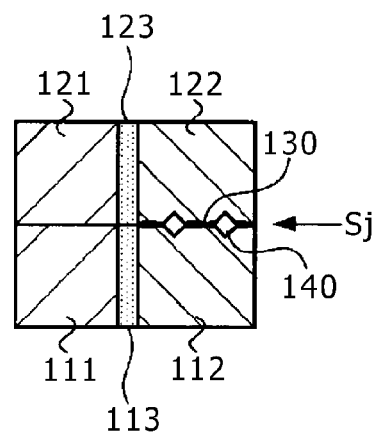

Specifically, for example, when the first substrate 110 and the second substrate 120 in the mutually adhered state are subjected to a heating treatment, the treatment causes hydrogen diffused in the Cu wirings and the oxygen 130 remaining at the joint interface Sj to react with each other, forming water (water vapor). As a result, voids 140 are formed at the joint interface Sj between the first Cu wiring 112 and the second Cu wiring 122, as shown in FIG. 2C.

Figure 2D:
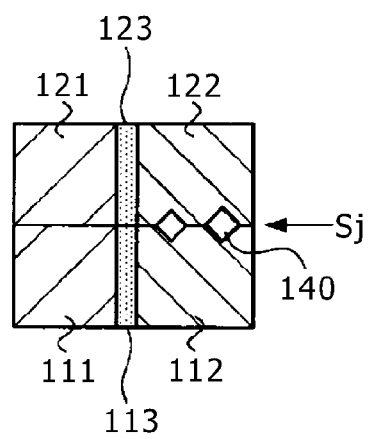

When the heating treatment is continued thereafter, the voids 140 generated at the joint interface Sj aggregate, leading to an increase in the size of the voids 140 as shown in FIG. 2D. Upon generation of the large-sized voids 140 at the joint interface Sj in this manner, such a phenomenon as defects in continuity or an increase in wiring resistance may occur at the Cu—Cu joint interface, thereby lowering the reliability of the semiconductor apparatus 100. Incidentally, the above-mentioned problem may be a serious problem, for example in a use wherein the joint between the wiring patterns is several micrometers or below in size.

Outline of Cu—Cu Joining Technique According to an Embodiment of the Present Disclosure An embodiment of the present disclosure proposes a Cu—Cu joining technique which lowers the possibility of generation of voids 140 at the joint interface Sj, so as to solve the above-mentioned problem. Here, referring to FIGS. 3A to 3D, an outline of the Cu—Cu joining technique according to an embodiment of the present disclosure and the principle of restraining formation of voids 140 in the present disclosure will be described. FIGS. 3A to 3D illustrate the treatment procedure of the Cu—Cu joining technique according to an embodiment of the present disclosure. In FIGS. 3A to 3D, for simplification of description, only a part of the Cu—Cu joint interface (for example, the region surrounded by broken line A in FIG. 1) is shown in an enlarged form. Besides, in an example shown in FIGS. 3A to 3D, the same components as those in the example shown in FIGS. 2A to 2D above are denoted by the same reference symbols as used above. Furthermore, in FIGS. 3A to 3C, for simplification of description, only the configuration of the vicinity of the Cu joint interface on the first substrate 110 side is illustrated.

Figure 3A:
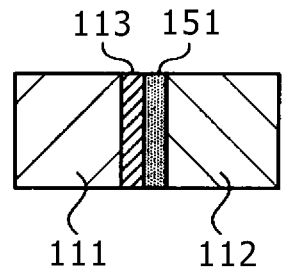
FIGS. 3A to 3D illustrate the principle of a Cu—Cu joining technique according to an embodiment of the present disclosure.

In the present disclosure, first, as shown in FIG. 3A, a first oxygen gettering layer 151 and a first Cu barrier layer 113 are provided between a first Cu wiring 112 and a first SiO₂ layer 111 in a first substrate 110, which is not shown in FIGS. 3A to 3D. The first oxygen gettering layer 151 and the first Cu barrier layer 113 are disposed in this order along the direction from the first Cu wiring 112 toward the first SiO₂ layer 111.

The first oxygen gettering layer 151 has a Cu layer containing a metallic material which reacts with oxygen more easily than hydrogen does (the metallic material will hereafter be referred to as the "gettering material"). More specifically, the first oxygen gettering layer 151 contains a gettering material which forms a metallic oxide by reacting with oxygen at a standard energy of formation lower than the standard energy of formation necessary for hydrogen and oxygen to react with each other to form water. Incidentally, the content of the gettering material in the first oxygen gettering layer 151 may be set arbitrarily according to such conditions as the intended use (required reliability); for example, the gettering material content may be a few percent.

Or, in the present disclosure, the first oxygen gettering layer 151 may be formed of the gettering material. It is to be noted here, however, that a configuration in which the first oxygen gettering layer 151 is composed of a Cu layer containing the gettering material has a merit as follows. In the case where the first Cu wiring 112 is formed on the first oxygen gettering layer 151 by a plating method, for example, the Cu contained in the first oxygen gettering layer 151 can be utilized as nuclei for formation of the first Cu wiring 112.

The gettering material may be any metallic material that has the above-mentioned property. Examples of the metallic material which can be used as the gettering material include Fe, Mn, V, Cr, Mg, Si, Ce, Ti, and Al. Among these gettering materials, Mn, Mg, Ti and Al are materials suitable for use in semiconductor apparatuses. Furthermore, from the viewpoint of lowering the wiring resistance in the vicinity of the joint interface, it is particularly preferable to use Mn or Ti as the gettering material. Besides, either only one of the above-mentioned metallic materials or a plurality of the metallic materials may be contained in the first oxygen gettering layer 151 as gettering material.

In addition, the first Cu barrier layer 113 not only prevents diffusion of Cu from the first oxygen gettering layer 151 into the first SiO₂ layer 111 but also prevents diffusion of the gettering material contained in the first oxygen gettering layer 151 into the first SiO₂ layer 111. Incidentally, the first Cu barrier layer 113 is formed, for example, from Ti, Ta, Ru, or a nitride thereof. Incidentally, in order that diffusion of the gettering material from the first oxygen gettering layer 151 into the first SiO₂ layer 111 is prevented more securely, it is preferable to form the first Cu barrier layer 113 from nitride of Ti, nitride of Ta, or nitride of Ru.

Figure 3B:
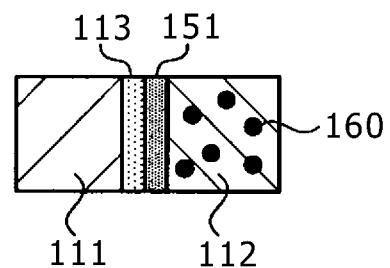

Next, after the first oxygen gettering layer 151 and the first Cu barrier layer 113 configured as above are provided between the first Cu wiring 112 and the first SiO$_2$ layer 111, the first Cu wiring 112 is annealed (is subjected to a heating treatment). This annealing treatment causes the gettering material 160 contained in the first oxygen gettering layer 151 to diffuse from the first oxygen gettering layer 151 into the first Cu wiring 112, as shown in FIG. 3B. Incidentally, the concentration of the gettering material 160 thus diffusing into the first Cu wiring 112 can be controlled by appropriately setting the content of the gettering material 160 in the first oxygen gettering layer 151.

Figure 3C:
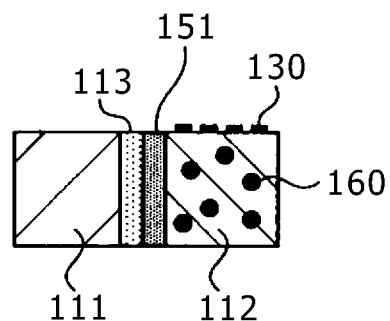

Subsequently, the joint-side surface of the first Cu wiring 112 is subjected to a reducing treatment such as chemical liquid cleaning (wet etching) or dry etching, to remove oxygen (oxides) from the joint-side surface of the first Cu wiring 112. Even by the reducing treatment, however, it is difficult to completely remove oxygen (oxides) from the joint-side surface of the first Cu wiring 112. As shown in FIG. 3C, therefore, some oxygen 130 is left on the joint-side surface of the first Cu wiring 112 after the reducing treatment.

In addition, the various treatments described referring to FIGS. 3A to 3C above are applied also to the second substrate 120 (not shown in FIGS. 3A to 3D). Specifically, a second oxygen gettering layer 152 (see FIG. 3D) containing a gettering material which reacts with oxygen more easily than hydrogen does is provided between a second Cu wiring 122 and a second Cu barrier layer 123. Then, the second Cu wiring 122 is annealed to cause the gettering material 160 to diffuse into the second Cu wiring 122, followed by the above-mentioned reducing treatment of the joint-side surface of the second Cu wiring 122.

Next, the first substrate 110 and the second substrate 120 having been subjected to the above-mentioned various treatments are adhered to each other, and the first Cu wiring 112 and the second Cu wiring 122 are joined to each other. Incidentally, in this case, some oxygen 130 is left at the joint interface Sj between the first Cu wiring 112 and the second Cu wiring 122. Then, the first substrate 110 and the second substrate 120 in the mutually adhered state are subjected to a heating treatment.

Figure 3D:
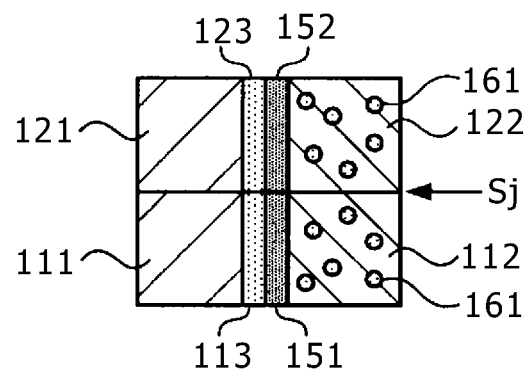

This heating treatment causes the oxygen 130 remaining in the vicinity of the joint interface Sj to react with the gettering material 160 (to be trapped by the gettering material 160) which reacts with oxygen more easily than hydrogen diffusing through each Cu wiring does. This results in that, as shown in FIG. 3D, a metallic oxide 161 formed by a reaction between the oxygen 130 and the gettering material 160 is dispersed in each Cu wiring, particularly, in the vicinity of the joint interface Sj. Consequently, formation of water (water vapor) is restrained, and void formation is thereby prevented, in the vicinity of the joint interface Sj.

As above-mentioned, in the Cu—Cu joining technique according to an embodiment of the present disclosure, the gettering material 160 which reacts with oxygen more easily than hydrogen does is preliminarily diffused into the Cu wiring on each substrate, particularly, into the vicinity of the joint interface Sj. Besides, at the time of Cu—Cu joining, oxygen 130 remaining in the vicinity of the joint interface Sj is trapped by the gettering material 160, whereby generation of voids at the Cu—Cu joint interface is restrained. According to the Cu—Cu joining technique in the present disclosure, therefore, such problems as defects in continuity, an increase in wiring resistance and a lowering in reliability of the semiconductor apparatus can be solved.

Incidentally, while an example in which the first Cu barrier layer 113 is composed of a single layer has been described in the example shown in FIGS. 3A to 3D, this configuration is not restrictive. For instance, the first Cu barrier layer 113 may be composed of two layers including a Ti, Ta or Ru nitride layer and a Ti, Ta or Ru layer. It is to be noted here, however, that in this case from the viewpoint of preventing diffusion of the gettering material 160, the Ti, Ta or Ru nitride layer and the Ti, Ta or Ru layer are preferably disposed in this order along the direction from the first SiO$_2$ layer 111 toward the first Cu wiring 112.

Furthermore, where the first Cu barrier layer 113 is formed of Ti, the first Cu barrier layer 113 may be made to serve also as the first oxygen gettering layer 151. In addition, where the gettering material is diffused in the surface of the first SiO$_2$ layer 111, the need to provide the first oxygen gettering layer 151 and the first Cu barrier layer 113 may be eliminated. Besides, a configuration may be adopted in which the first oxygen gettering layer 151 is formed directly on the first SiO$_2$ layer 111, without providing the first Cu barrier layer 113.

2. First Embodiment

Configuration of Semiconductor Apparatus

Figure 4:
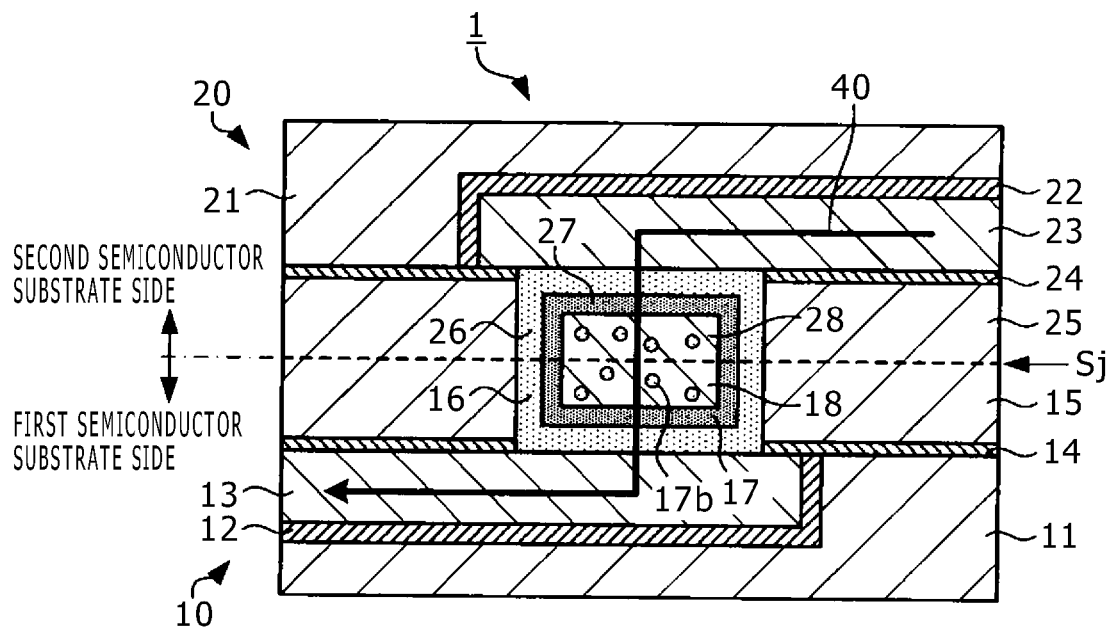
FIG. 4 is a schematic sectional view of the vicinity of a Cu—Cu joint interface in a semiconductor apparatus according to a first embodiment of the present disclosure.

FIG. 4 shows a configuration example of a first embodiment of the semiconductor apparatus, for example, a solid-state imaging apparatus, fabricated by use of the Cu—Cu joining technique according to an embodiment of the present disclosure as described referring to FIGS. 3A to 3D above. FIG. 4 is a schematic sectional view of the vicinity of the Cu—Cu joint interface in the semiconductor apparatus according to the first embodiment. Incidentally, in FIG. 4, for simplification of description, only the schematic configuration of the vicinity of one Cu—Cu joint interface is shown.

As shown in FIG. 4, the semiconductor apparatus 1 includes a first wiring part 10 (first semiconductor part) and a second wiring part 20 (second semiconductor part). In this embodiment, the surface of the first wiring part 10 on the side of a first interlayer dielectric 15 (described later) and the surface of the second wiring part 20 on the side of a second interlayer dielectric 25 (described later) are adhered to each other, whereby the semiconductor apparatus 1 is fabricated.

The first wiring part 10 includes a first semiconductor substrate (not shown), a first SiO$_2$ layer 11, a first Cu barrier film 12, a first Cu wiring body 13, a first Cu diffusion preventive film 14, the first interlayer dielectric 15, a first Cu barrier layer 16, a first oxygen gettering layer 17, and a first Cu wiring joint part 18.

The first SiO$_2$ layer 11 is formed on the first semiconductor substrate. The first Cu wiring body 13 is formed so as to be buried in the surface, on the side opposite to the first substrate side, of the first SiO$_2$ layer 11. Incidentally, the first Cu wiring body 13 is connected to a predetermined device, circuit or the like in the semiconductor apparatus 1 that is not shown in the figure.

The first Cu barrier film 12 is formed between the first SiO$_2$ layer 11 and the first Cu wiring body 13. Incidentally, the first Cu barrier film 12 is a thin film for preventing diffusion of copper (Cu) from the first Cu wiring body 13 into the first SiO$_2$ layer 11.

The first Cu diffusion preventive film 14 is formed over the region of the first SiO$_2$ layer 11 and the first Cu wiring body 13, and over the region other than the region in which the first Cu wiring joint part 18 is formed. In addition, the first interlayer dielectric 15 is formed on the first Cu diffusion preventive film 14. Incidentally, the first Cu diffusion preventive film 14 is a thin film for preventing diffusion of copper (Cu) from the first Cu wiring body 13 into the first interlayer dielectric 15, and is composed of a thin film of, for example, SiC, SiN, SiCN or the like.

Besides, in the present embodiment, as shown in FIG. 4, the first Cu barrier layer 16 and the first oxygen gettering layer 17 are formed between the first Cu wiring joint part 18 (first wiring) and the first Cu wiring body 13, the first Cu diffusion preventive film 14 and the first interlayer dielectric 15. Incidentally, the first oxygen gettering layer 17 and the first Cu barrier layer 16 are formed in this order from the side of the first Cu wiring joint part 18. Specifically, the first oxygen gettering layer 17 is so formed as to cover the surface of the first Cu wiring joint part 18 on the first Cu wiring body 13 side and the surfaces of the first Cu wiring joint part 18 on the first interlayer dielectric 15 side. In addition, the first Cu barrier layer 16 is so formed as to cover the surface of the first oxygen gettering layer 17 on the first Cu wiring body 13 side and the surfaces of the first oxygen gettering layer 17 on the first interlayer dielectric 15 side.

Furthermore, in the present embodiment, a metallic oxide 17b, which is formed by a reaction between the gettering material having diffused from the first oxygen gettering layer 17 and oxygen having remained in the vicinity of a joint interface Sj before joining, is dispersedly present in the inside of the first Cu wiring joint part 18 and in the vicinity of the joint-side surface of the first Cu wiring joint part 18. Incidentally, though not shown in FIG. 4, not only the metallic oxide 17b but also the gettering material not having reacted with oxygen may be present in the inside of the first Cu wiring joint part 18 and in the vicinity of the joint-side surface of the first Cu wiring joint part 18. In addition, in the case where a plurality of kinds of gettering materials are contained in the first oxygen gettering layer 17, a plurality of metallic oxides 17b are dispersedly present in the inside of the first Cu wiring joint part 18 and in the vicinity of the joint-side surface of the first Cu wiring joint part 18.

The second wiring part 20 includes a second semiconductor substrate (not shown), a second $SiO_2$ layer 21, a second Cu barrier film 22, a second Cu wiring body 23, a second Cu diffusion preventive film 24, the second interlayer dielectric 25, a second Cu barrier layer 26, a second oxygen gettering layer 27, and a second Cu wiring joint part 28.

Incidentally, in this embodiment, the second semiconductor substrate, the second $SiO_2$ layer 21, and the second Cu barrier film 22 of the second wiring part 20 are configured in the same manner as the first semiconductor substrate, the first $SiO_2$ layer 11, and the first Cu barrier film 12 of the first wiring part 10, respectively. Besides, the second Cu wiring body 23, the second Cu diffusion preventive film 24, and the second interlayer dielectric 25 of the second wiring part 20 are configured in the same manner as the first Cu wiring body 13, the first Cu diffusion preventive film 14, and the first interlayer dielectric 15 of the first wiring part 10, respectively. Furthermore, the second Cu barrier layer 26, the second oxygen gettering layer 27, and the second Cu wiring joint part 28 (second wiring) of the second wiring part 20 are also configured in the same manner as the first Cu barrier layer 16, the first oxygen gettering layer 17, and the first Cu wiring joint part 18 of the first wiring part 10, respectively. In addition, the positional relationships among the components of the second wiring part 20 are the same as those in the first wiring part 10.

In the semiconductor apparatus 1 configured as above, as shown in FIG. 4, a current 40 flows from the second Cu wiring body 23 of the second wiring part 20 and then through the second Cu barrier layer 26 and the second oxygen gettering layer 27, into the joint portion between the second Cu wiring joint part 28 and the first Cu wiring joint part 18. Then, the current 40 having flowed into the joint portion between the second Cu wiring joint part 28 and the first Cu wiring joint part 18 flows through the first oxygen gettering layer 17 and the first Cu barrier layer 16 into the first Cu wiring body 13.

[Semiconductor Apparatus Manufacturing Technique (Cu—Cu Joining Technique)]

Now, a technique of manufacturing the semiconductor apparatus 1 according to the present embodiment will be described below, referring to FIGS. 5A to 5G. In FIGS. 5A to 5G, only the treatment procedure of a Cu—Cu joining step in the semiconductor apparatus 1 according to this embodiment will mainly be shown. Therefore, FIGS. 5A to 5G show a schematic section in the vicinity of a Cu—Cu joint interface. In addition, a second wiring part 20 can be fabricated in the same manner as a first wiring part 10 in this embodiment. Therefore, as for other treatments (FIGS. 5A to 5F) than an adhering treatment (FIG. 5G), only treatments of the first wiring part 10 will be described here, for simplification of description.

Figure 5A:
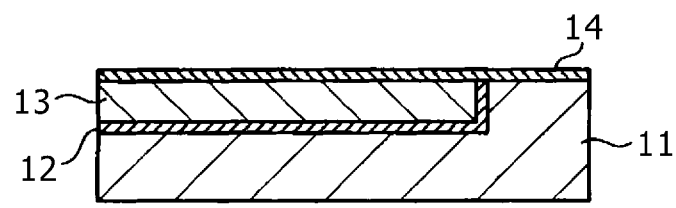
FIGS. 5A to 5G are views for illustrating the procedure of fabrication of the semiconductor apparatus according to the first embodiment.

In the present embodiment, though not shown, first, a first Cu barrier film 12 and a first Cu wiring body 13 are formed in this order in a predetermined region on the surface on one side of a first $SiO_2$ layer 11 (underlying dielectric layer). In this case, the first Cu wiring body 13 is so formed as to be buried in the first $SiO_2$ layer 11. Next, as shown in FIG. 5A, a first Cu diffusion preventive film 14 is formed on the surface on the first Cu wiring body 13 side of a wiring structure part including the first $SiO_2$ layer 11, the first Cu barrier film 12 and the first Cu wiring body 13. Incidentally, the first $SiO_2$ layer 11, the first Cu barrier film 12, the first Cu wiring body 13 and the first Cu diffusion preventive film 14 can be formed in the same manner as in a technique of manufacturing a semiconductor apparatus such as a solid-state imaging apparatus according to the related art (see, for example, Japanese Patent No. 4193438).

Figure 5B:
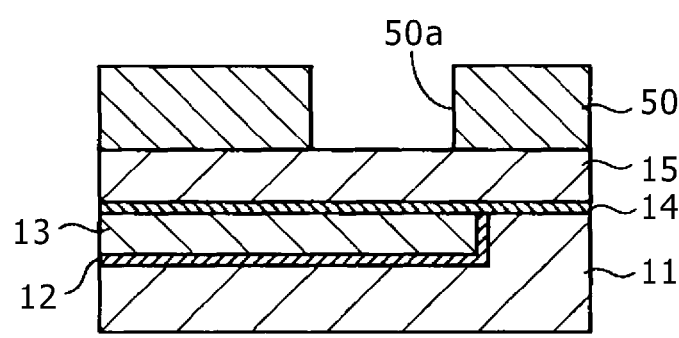

Subsequently, in this embodiment, as shown in FIG. 5B, a first interlayer dielectric 15 is formed on the first Cu diffusion preventive film 14. In this instance, for example, a $SiO_2$ film or a carbon-containing silicon oxide (SiOC) film having a thickness of about 50 to 500 nm is formed on the first Cu diffusion preventive film 14, to form the first interlayer dielectric 15. Such a first interlayer dielectric 15 can be formed, for example, by a CVD (Chemical Vapor Deposition) or spin coating. Next, a resist 50 is formed on the first interlayer dielectric 15. Thereafter, the resist 50 is subjected to a patterning treatment by use of a photolithographic technique to remove the resist 50 from a region where to form a first Cu wiring joint part 18, whereby an opening part 50a is formed.

Figure 5C:
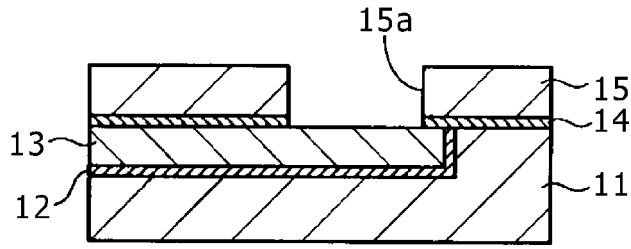

Next, as shown in FIG. 5C, for example by use of a known etching apparatus of a magnetron system, a dry etching treatment is applied from the side of the patterned resist 50, whereby the region of the first interlayer dielectric 15 exposed in the opening part 50a of the resist 50 is etched away. In this etching treatment, as shown in FIG. 5C, the first interlayer dielectric 15 and the first Cu diffusion preventive film 14 in the region of the opening part 50a of the resist 50 are removed, whereby the first Cu wiring body 13 is exposed in an opening part 15a of the first interlayer dielectric 15. Thereafter, the thus etched surface is subjected to an ashing treatment using, for example, an oxygen ($O_2$) plasma and to a cleaning treatment using an organic amine chemical liquid, whereby the resist 50 remaining on the first interlayer dielectric 15 and the residue deposited upon the etching treatment are removed.

Figure 5D:
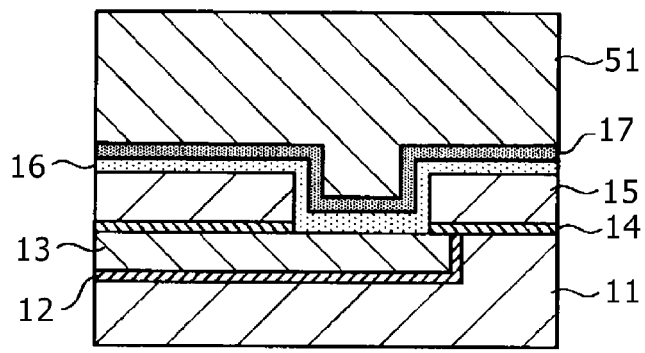

Subsequently, as shown in FIG. 5D, a first Cu barrier layer 16 of Ti, Ta, Ru or a nitride thereof is formed on the first interlayer dielectric 15 and on the first Cu wiring body 13 exposed in the opening part 15a of the first interlayer dielectric 15. In this case, the first Cu barrier layer 16 having a thickness of about 5 to 50 nm is formed in an $Ar/N_2$ atmosphere by use of such a technique as RF (Radio Frequency) sputtering, for example. Next, a first oxygen gettering layer 17 is formed in a thickness of about 1 to 50 nm on the first Cu barrier layer 16 by use of such a technique as RF sputtering, for example. Thereafter, a Cu film 51 is formed on the first oxygen gettering layer 17 by such a technique as electrolytic plating or sputtering, for example. As a result of these treatments, the Cu film 51 is buried in the region of the opening part 15a of the first interlayer dielectric 15, as shown in FIG. 5D.

Figure 5E:
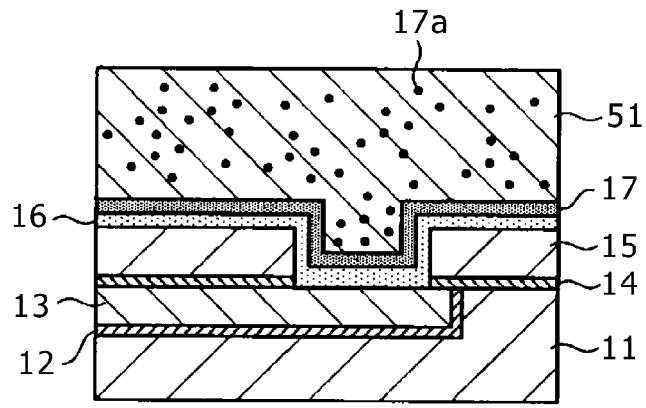

Next, the film formed member with the Cu film 51 buried in the region of the opening part 15a of the first interlayer dielectric 15 is heated at about 100 to 400° C. for about 1 to 60 minutes in a nitrogen atmosphere or vacuum by use of such a heating apparatus as a hot plate or a sintering-annealing apparatus, for example. This heating treatment is carried out not only for tightening the Cu film 51 to form a denser Cu film 51 but also for causing the gettering material contained in the first oxygen gettering layer 17 to diffuse into the Cu film 51. As a result of the heating treatment, therefore, the gettering material 17a contained in the first oxygen gettering layer 17 is diffused (dispersed) into the Cu film 51, as shown in FIG. 5E. Incidentally, in the present embodiment, the conditions of the heating treatment are so controlled that a sufficient amount of the gettering material 17a is diffused into the Cu film 51.

Figure 5F:
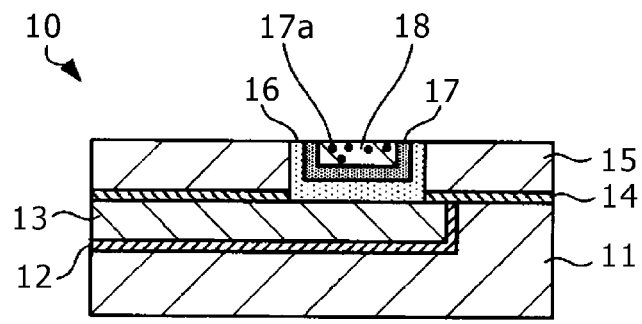

Then, as shown in FIG. 5F, unnecessary portions of the Cu film 51, the first Cu barrier layer 16, and the first oxygen gettering layer 17 are removed by chemical-mechanical polishing (CMP). Specifically, the surface of the film formed member on the Cu film 51 side is polished by CMP until the first interlayer dielectric 15 is exposed to the surface.

In the present embodiment, the treatments described referring to FIGS. 5A to 5F above are carried out, to fabricate a first wiring part 10. Besides, in this embodiment, a second wiring part 20 is fabricated in the same manner as the first wiring part 10.

Figure 5G:
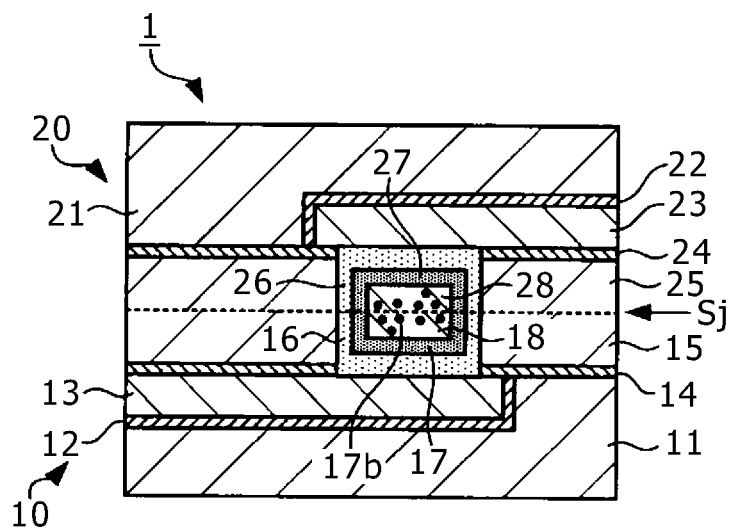

Then, as shown in FIG. 5G, the first wiring part 10 and the second wiring part 20 fabricated by the above-mentioned treatment procedure are adhered to each other. Specific treatment steps of this adhering treatment are as follows.

First, the surface on the first Cu wiring joint part 18 side of the first wiring part 10 and the surface on the second Cu wiring joint part 28 side of the second wiring part 20 are subjected to a reducing treatment, to remove oxide film (oxides) from the Cu surface of each wiring joint part. This ensures that clean Cu is exposed at the Cu surfaces of the each wiring joint part. Incidentally, as the reducing treatment in this instance, there can be used a wet etching treatment based on the use of, for example, formic acid or a dry etching treatment based on the use of, for example, an Ar, $NH_3$, $H_2$ or the like plasma.

Next, the surface on the first Cu wiring joint part 18 side of the first wiring part 10 and the surface on the second Cu wiring joint part 28 side of the second wiring part 20 are brought into contact with (adhered to) each other. In this case, the first Cu wiring joint part 18 and the second Cu wiring joint part 28 are aligned to face each other, before the adhesion.

Subsequently, the adhered member having the first wiring part 10 and the second wiring part 20 in the adhered state is annealed by use of a heating apparatus, for example, a hot plate or an RTA (Rapid Thermal Annealing) apparatus, to join the first Cu wiring joint part 18 and the second Cu wiring joint part 28 to each other. Specifically, the adhered member is heated at about 100 to 400° C. for about five minutes to two hours in a $N_2$ atmosphere at the atmospheric pressure or in vacuum, for example. In this case, oxygen remaining in the vicinity of the joint interface Sj between the first wiring part 10 and the second wiring part 20 reacts with the gettering material(s) 17a preliminarily diffused into the vicinity of the joint interface Sj and into the inside of the Cu wiring joint parts, to form a metallic oxide(s) 17b.

In the present embodiment, the Cu—Cu joining step is carried out in this manner. Incidentally, other steps for manufacturing the semiconductor apparatus 1 than the above-described Cu—Cu joining step can be performed in the same manner as, for example, in a semiconductor apparatus manufacturing method according to a related art.

As above-described, in the semiconductor apparatus 1 according to this embodiment, prior to joining of the first wiring part 10 and the second wiring part 20, the gettering material 17a which reacts with oxygen more easily than hydrogen does is preliminarily diffused into the inside of each Cu wiring joint part and into the vicinity of the joint-side surface of each Cu wiring joint part. This ensures that upon the annealing treatment in joining the first wiring part 10 and the second wiring part 20 to each other, oxygen remaining in the vicinity of the joint interface Sj is trapped by the gettering material 17a in the Cu wiring joint parts. As a result, formation of water (water vapor), which would lead to void formation, is restrained from occurring in the vicinity of the joint interface Sj. According to this embodiment, therefore, it is possible to provide a semiconductor apparatus 1 having a more reliable Cu—Cu joint interface.

Besides, in this embodiment, since generation of voids in the vicinity of the joint interface Sj can be restrained, an increase in connection resistance can be suppressed. As a result, problems which might be generated attendantly on an increase in connection resistance, such as heat generation and a delay in processing circuits, can be restrained; accordingly, a lowering in the processing speed of the semiconductor apparatus 1 can be prevented.

Furthermore, in the present embodiment, both the heating treatment for tightening the Cu film 51 to form a denser Cu film 51 and the heating treatment for diffusing the gettering material 17a into the Cu film 51 can be carried out by a single heating treatment. In this embodiment, therefore, the number of process steps in manufacturing the semiconductor apparatus 1 can be reduced.

3. Second Embodiment

In the second embodiment of the present disclosure, an example wherein the semiconductor apparatus 1 of the first embodiment described referring to FIG. 4 above is manufactured by a technique different from that in the first embodiment will be described. Accordingly, in describing this embodiment, descriptions of the configuration of the semiconductor apparatus 1 will be omitted, and only the manufacturing technique therefor will be described.

The technique of manufacturing the semiconductor apparatus 1 according to the present embodiment will be described referring to FIGS. 6A to 6G. Incidentally, in FIGS. 6A to 6G, only the treatment procedure of a Cu—Cu joining step in the semiconductor apparatus 1 according to this embodiment will be mainly shown. Therefore, FIGS. 6A to 6G show a schematic section in the vicinity of a Cu—Cu joint interface. Besides, in this embodiment, a second wiring part 20 can be fabricated in the same manner as a first wiring part 10. Therefore, as for other treatments (FIGS. 6A to 6F) than an adhering treatment (FIG. 6G), only the treatments of the first wiring part 10 will be described here, for simplification of description. Incidentally, the other steps for manufacturing the semiconductor apparatus 1 than the Cu—Cu joining step can be carried out in the same manner, for example, as in a method of manufacturing a semiconductor apparatus such as a solid-state imaging apparatus according to a related art.

Figure 6A:
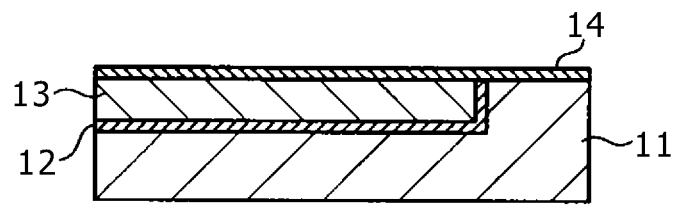
FIGS. 6A to 6G are views for illustrating the procedure of fabrication of a semiconductor apparatus according to a second embodiment of the present disclosure.
Figure 6B:
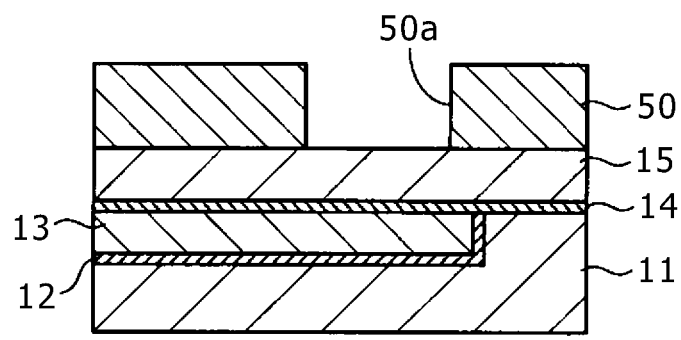
Figure 6C:
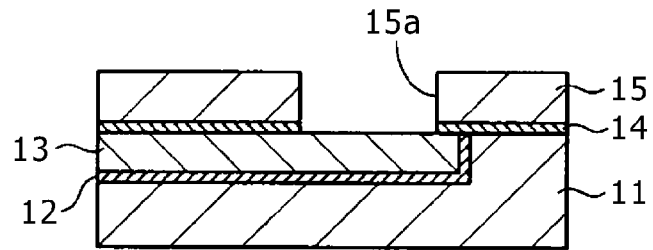

As is clear from comparison of FIGS. 6A to 6C with FIGS. 5A to 5C, the treatments ranging from the formation of the wiring structure part having a first $SiO_2$ layer 11, a first Cu barrier film 12 and a first Cu wiring body 13 to the patterning of a first interlayer dielectric 15 in this second embodiment are the same as those in the first embodiment above. Therefore, descriptions of the treatments shown in FIGS. 6A to 6C are omitted here.

Figure 6D:
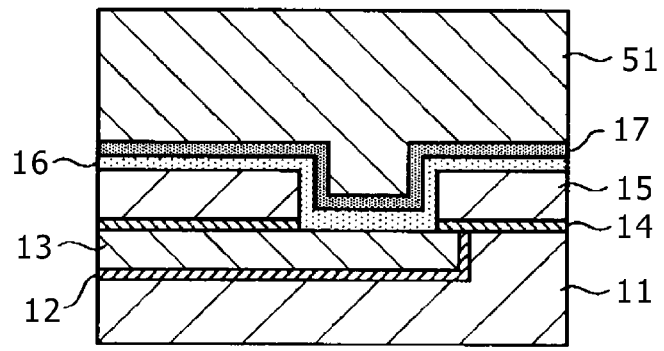

After the first Cu wiring body 13 is exposed in an opening part 15a of the first interlayer dielectric 15 by an etching treatment shown in FIG. 6C, a first Cu barrier layer 16 is formed on the surface on the opening part 15a side of the first interlayer dielectric 15 as shown in FIG. 6D, in the same manner as in the first embodiment above. Next, a first oxygen gettering layer 17 is formed in a thickness of about 1 to 50 nm on the first Cu barrier layer 16, in the same manner as in the first embodiment above. Subsequently, a Cu film 51 is formed on the first oxygen gettering layer 17 by such a technique as electrolytic plating or sputtering. By these treatments, the Cu film 51 is buried in the region of the opening part 15a of the first interlayer dielectric 15, as shown in FIG. 6D.

Next, the film formed member having the Cu film 51 buried in the region of the opening part 15a of the first interlayer dielectric 15 is subjected to a heating treatment, whereby the Cu film 51 is tightened to form a denser Cu film 51. Incidentally, this heating treatment is carried out in such heating conditions that the gettering material(s) contained in the first oxygen gettering layer 17 would not diffuse into the Cu film 51.

Figure 6E:
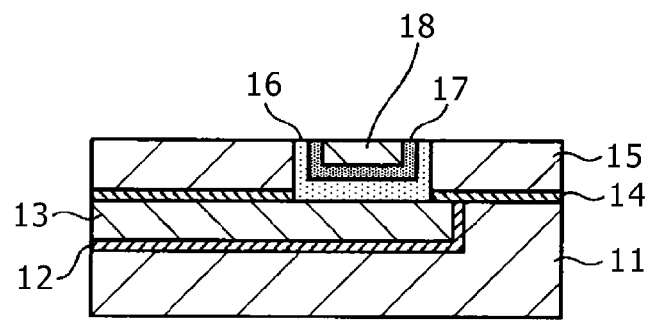

Subsequently, as shown in FIG. 6E, unnecessary portions of the Cu film 51, the first Cu barrier layer 16, and the first oxygen gettering layer 17 are removed by CMP. Specifically, the surface on the Cu film 51 side of the film formed member is polished by CMP until the first interlayer dielectric 15 is exposed to the surface. As a result, a first Cu wiring joint part 18 is formed.

Figure 6F:
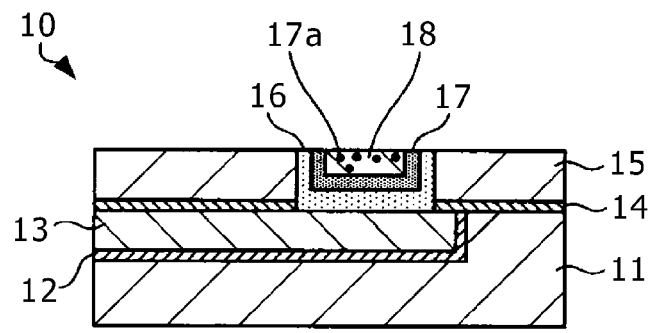

Next, after the polishing treatment, the film formed member is heated at about 100 to 400° C. for about 1 to 60 minutes in a nitrogen atmosphere or vacuum by use of such a heating apparatus as a hot plate or a sintering-annealing apparatus. By this heating treatment, in the present embodiment, the gettering material 17a contained in the first oxygen gettering layer 17 is diffused into the Cu film 51. Therefore, this heating treatment causes the gettering material 17a to be diffused (dispersed) into the vicinity of the joint-side surface of the first Cu wiring joint part 18 and into the inside of the first Cu wiring joint part 18, as shown in FIG. 6F.

Figure 6G:
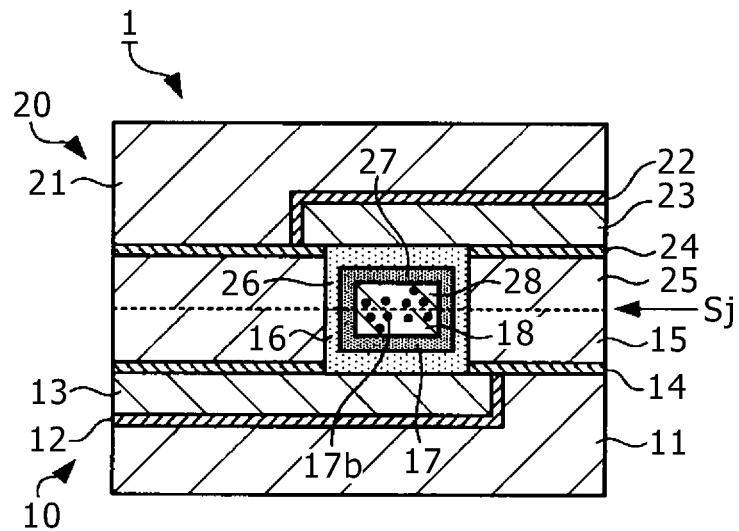

In the present embodiment, the above-described treatments shown in FIGS. 6A to 6F are carried out, to fabricate the first wiring part 10. Besides, in this embodiment, the second wiring part 20 is fabricated in the same manner as the first wiring part 10. Then, as shown in FIG. 6G, the first wiring part 10 and the second wiring part 20 fabricated following the above-mentioned treatment procedure are adhered to each other. The adhering treatment is the same as the adhering treatment (FIG. 5G) described in the first embodiment above, and, therefore, description thereof is omitted here.

In the present embodiment, the semiconductor apparatus 1 is manufactured in the above-described manner. As above-mentioned, in this embodiment, like in the first embodiment above, the gettering material 17a which reacts with oxygen more easily than hydrogen does is preliminarily diffused into the inside of the Cu wiring joint part and into the vicinity of the joint-side surface of the Cu wiring joint part, before adhesion of the first wiring part 10 and the second wiring part 20. In this embodiment, therefore, the same effect as that of the first embodiment above can be obtained.

In addition, while the treatment for diffusion of the gettering material 17a has been performed before the polishing of the Cu film 51 in the first embodiment above, in this embodiment the treatment for diffusion of the gettering material 17a is conducted after the polishing treatment of the Cu film 51 (after the formation of the first Cu wiring joint part 18). In this case, it is possible in this embodiment to reduce the possible diffusion region (the volume of the diffusion region) of the gettering material 17a, as compared with that in the first embodiment above. Therefore, from such viewpoints as effective utilization of the gettering material 17a and the ease of control of the concentration of the gettering material 17a in the first Cu wiring joint part 18, for example, the manufacturing technique in this embodiment has an advantage over that in the first embodiment.

It is to be noted here, however, that while the respective heating treatments are carried out individually for tightening the Cu film 51 and for diffusing the gettering material 17a in the present embodiment, both the treatments can be carried out by a single heating treatment in the first embodiment as above-mentioned. Therefore, from the viewpoint of reducing the number of process steps, the manufacturing technique according to the first embodiment is advantageous over that according to this second embodiment.

4. Third Embodiment

While an example wherein the oxygen gettering layer is provided between the Cu wiring joint part and the Cu barrier layer has been described in the first and second embodiments above, a configuration example wherein no oxygen gettering layer is provided between a Cu wiring joint part and a Cu barrier layer will be described in this third embodiment.

[Configuration of Semiconductor Apparatus]

Figure 7:
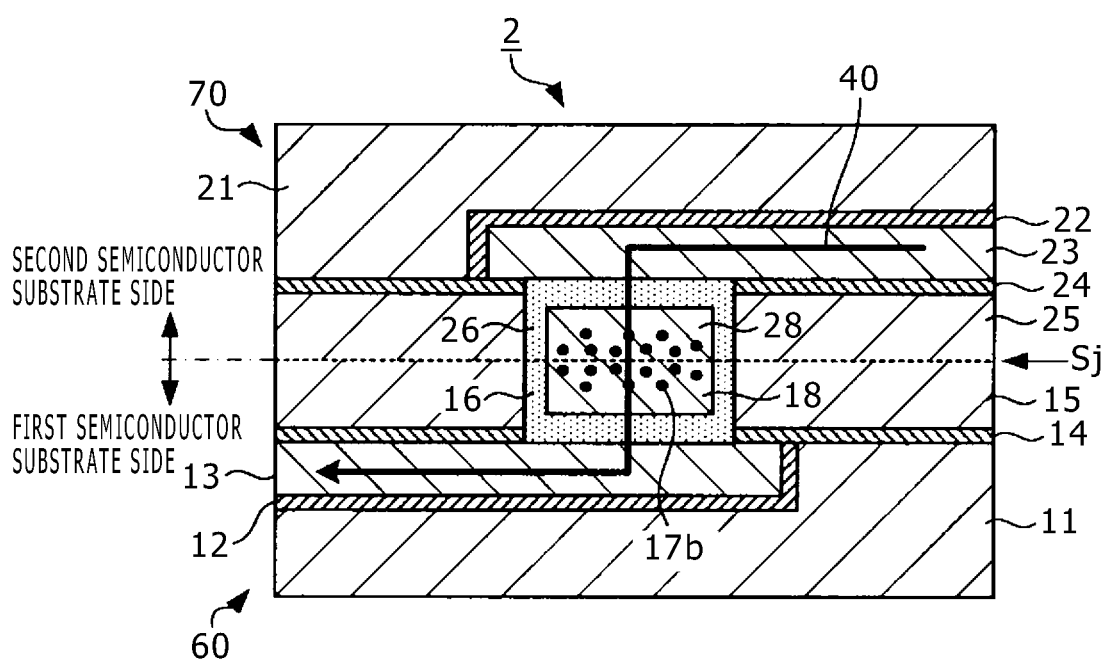
FIG. 7 is a schematic sectional view of the vicinity of a Cu—Cu joint interface in a semiconductor apparatus according to a third embodiment of the present disclosure.

FIG. 7 shows an example of a semiconductor apparatus, for example, a solid-state imaging apparatus, according to the present embodiment. FIG. 7 is a schematic sectional view of the vicinity of a Cu—Cu joint interface in the semiconductor apparatus according to this embodiment. For simplification of description, FIG. 7 shows only a schematic configuration of the vicinity of one Cu—Cu joint interface. Besides, in the semiconductor apparatus 2 in this embodiment shown in FIG. 7, the same configurations as those in the semiconductor apparatus 1 in the first embodiment above are denoted by the same reference symbols as used above.

As shown in FIG. 7, the semiconductor apparatus 2 includes a first wiring part 60 (first semiconductor part) and a second wiring part 70 (second semiconductor part). Besides, in this embodiment, like in the first embodiment above, the surface on the first interlayer dielectric 15 side of the first wiring part 60 and the surface on the second interlayer dielectric 25 side of the second wiring part 70 are adhered to each other, to fabricate the semiconductor apparatus 2.

The first wiring part 60 includes a first semiconductor substrate (not shown), a first $SiO_2$ layer 11, a first Cu barrier film 12, a first Cu wiring body 13, a first Cu diffusion preventive film 14, the first interlayer dielectric 15, a first Cu barrier layer 16, and a first Cu wiring joint part 18 (first wiring). Incidentally, as is clear from comparison of FIG. 7 with FIG. 4, the configuration of the first wiring part 60 in the present embodiment is the same as the configuration of the first wiring part 10 in the first embodiment above, except that the oxygen gettering layer is not provided between the first Cu barrier layer 16 and the first Cu wiring joint part 18.

On the other hand, the second wiring part 70 includes a second semiconductor substrate (not shown), a second $SiO_2$ layer 21, a second Cu barrier film 22, a second Cu wiring body 23, a second Cu diffusion preventive film 24, the second interlayer dielectric 25, a second Cu barrier layer 26, and a second Cu wiring joint part 28 (second wiring). Incidentally, as is clear from comparison of FIG. 7 with FIG. 4, the configuration of the second wiring part 70 in this embodiment is the same as the configuration of the second wiring part 20 in the first embodiment above, except that the oxygen gettering layer is not provided between the second Cu barrier layer 26 and the second Cu wiring joint part 28.

In the semiconductor apparatus 2 according to this embodiment, as shown in FIG. 7, a current 40 flows from the second Cu wiring body 23 of the second wiring part 20 and through the second Cu barrier layer 26 into a joint portion between the second Cu wiring joint part 28 and the first Cu wiring joint part 18. Then, the current 40 having flowed into the joint portion between the second Cu wiring joint part 28 and the first Cu wiring joint part 18 flows through the first Cu barrier layer 16 into the first Cu wiring body 13.

[Semiconductor Apparatus Manufacturing Technique (Cu—Cu Joining Technique)]

Now, a technique of manufacturing the semiconductor apparatus 2 according to this embodiment will be described below, referring to FIGS. 8A to 8J. FIGS. 8A to 8J mainly illustrate only the treatment procedure of a Cu—Cu joining technique in the semiconductor apparatus 2 of the present embodiment. Therefore, FIGS. 8A to 8J show a schematic section of the vicinity of a Cu—Cu joint interface. In addition, in this embodiment, the second wiring part 70 can be fabricated in the same manner as the first wiring part 60. As for other treatments (FIGS. 8A to 8I) than an adhering treatment (FIG. 8J), therefore, only treatments of the first wiring part 60 will be described here, for simplification of description. Incidentally, the other steps in manufacturing the semiconductor apparatus 2 than the Cu—Cu joining step can be carried out in the same manner as in a method of manufacturing a semiconductor apparatus, for example, a solid-state imaging apparatus, according to a related art.

Figure 8A:
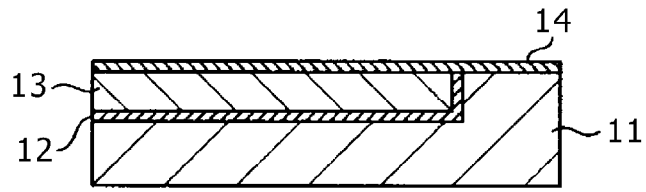
FIGS. 8A to 8J are views for illustrating the procedure of fabrication of the semiconductor apparatus according to the third embodiment.
Figure 8B:
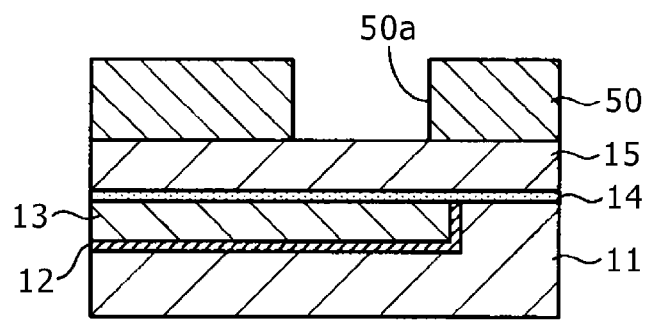
Figure 8C:
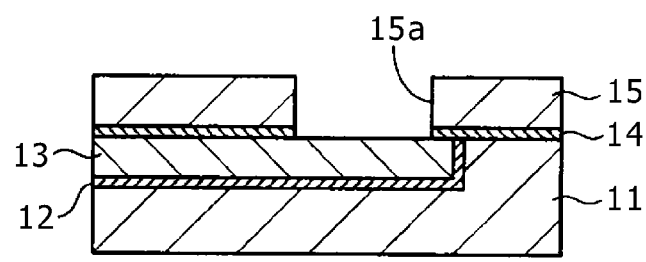

As is clear from comparison of FIGS. 8A to 8C with FIGS. 5A to 5C, treatments ranging from the formation of a wiring structure part having a first $SiO_2$ layer 11, a first Cu barrier film 12 and a first Cu wiring body 13 to the patterning of a first interlayer dielectric 15 are the same as those in the first embodiment above. Therefore, descriptions of the treatments shown in FIGS. 8A to 8C are omitted here.

Figure 8D:
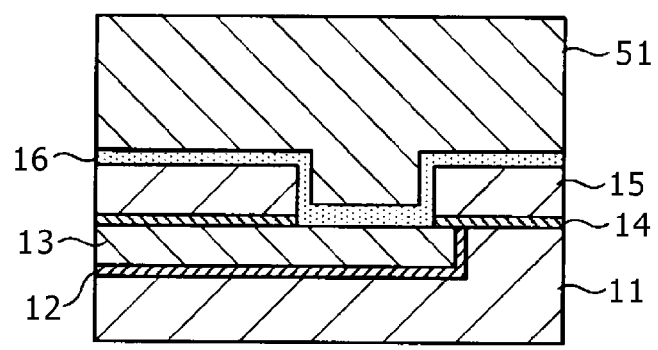

After the first Cu wiring body 13 is exposed in an opening part 15a of the first interlayer dielectric 15 by an etching treatment shown in FIG. 8C, a first Cu barrier layer 16 is formed on the surface on the opening part 15a side of the first interlayer dielectric 15 as shown in FIG. 8D, in the same manner as in the first embodiment above. Subsequently, a Cu film 51 is formed on the first Cu barrier layer 16 in the same manner as in the first embodiment above. By these treatments, as shown in FIG. 8D, the Cu film 51 is buried in the region of the opening part 15a of the first interlayer dielectric 15.

Next, the film formed member having the Cu film 51 buried in the region of the opening part 15a of the first interlayer dielectric 15 is heated at about 100 to 400° C. for about 1 to 60 minutes by use of a heating apparatus, for example, a hot plate or an annealing apparatus. By this heating, the Cu film 51 is tightened to form a denser Cu film 51.

Figure 8E:
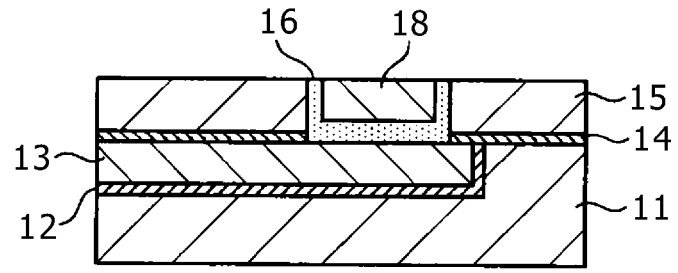

Subsequently, as shown in FIG. 8E, unnecessary portions of the Cu film 51 and the first Cu barrier layer 16 are removed by CMP. Specifically, the surface on the Cu film 51 side of the film formed member is polished by CMP until the first interlayer dielectric 15 is exposed to the surface. As a result, the first Cu wiring joint part 18 is formed.

Next, the surface on the first Cu wiring joint part 18 side of the first wiring part 60 is subjected to a reducing treatment, to remove an oxide film (oxides) from the surface of the first Cu wiring joint part 18. Specifically, the surface of the first Cu wiring joint part 18 is subjected to a wet etching treatment based on the use of, for example, formic acid or a dry etching treatment based on the use of, for example, an Ar, $NH_3$, $H_2$ or the like plasma. This results in that clear Cu is exposed at the surface of the first Cu wiring joint part 18.

Figure 8F:
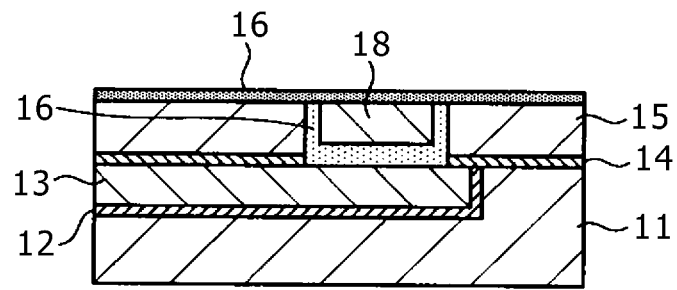

Subsequently, as shown in FIG. 8F, a first oxygen gettering layer 61 is formed in a thickness of about 1 to 50 nm on the surface on the first Cu wiring joint part 18 side of the first interlayer dielectric 15 (which has undergone the reducing treatment) by use of such a technique as RF sputtering, for example. Incidentally, in this embodiment, before the formation of the first oxygen gettering layer 61, the surface on the first Cu wiring joint part 18 side of the first interlayer dielectric 15 is preferably subjected to a sputtering treatment by use of an inert gas, for example, Ar gas.

Figure 8G:
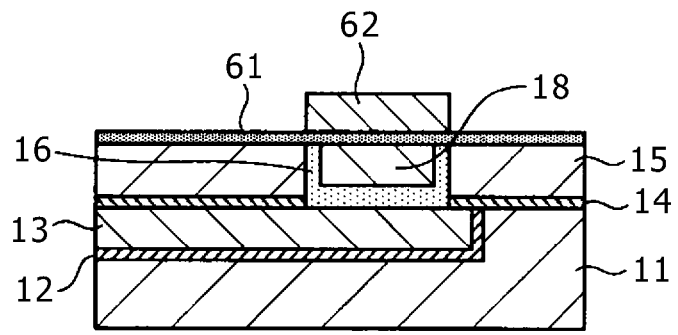

Next, a resist 62 is formed on the first oxygen gettering layer 61. Thereafter, the resist 62 is subjected to a patterning treatment by use of a photolithographic technique. By this treatment, as shown in FIG. 8G, the resist 62 is left only on the formation region of the first Cu wiring joint part 18 and the first Cu barrier layer 16, while the resist 62 formed on the other regions is removed.

Figure 8H:
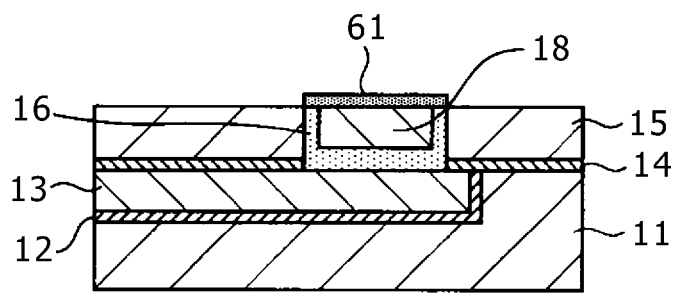

Subsequently, the first oxygen gettering layer 61 is subjected to dry etching by use of, for example, a known ICP (Induced Coupled Plasma) etching system. By this dry etching, as shown in FIG. 8H, that portion of the first oxygen gettering layer 61 which is not covered with the resist 62 is removed. Thereafter, a chemical liquid treatment is conducted by use of an organic solvent, such as NMP (N-metylpyrrolidone) or thinner, and an ammonium fluoride solution, whereby the resist 62 remaining on the first interlayer dielectric 15 and the residue deposited upon the etching treatment are completely removed.

Figure 8I:
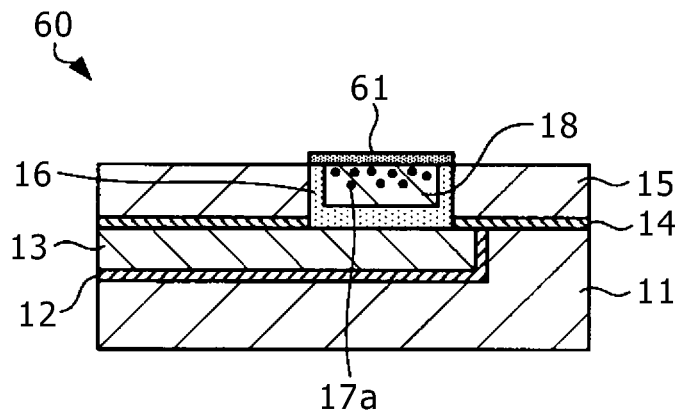

Next, the film formed member with the first oxygen gettering layer 61 formed as above is heated at about 100 to 400° C. for about one minute to two hours in, for example, a $N_2$ atmosphere at the atmospheric pressure or vacuum by use of a heating apparatus, for example, a hot plate or an RTA apparatus. By this heating treatment in this embodiment, as shown in FIG. 8I, the gettering material 17a contained in the first oxygen gettering layer 61 is diffused into the first Cu wiring joint part 18.

Figure 8J:
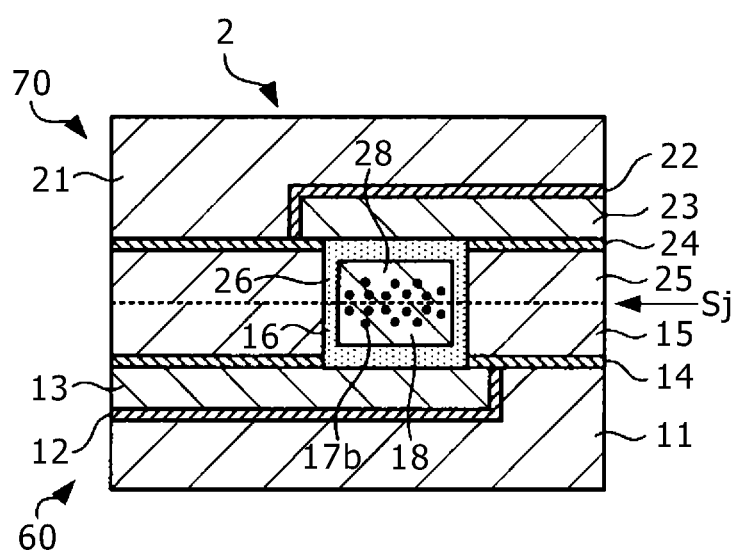

In the present embodiment, the treatments shown in FIGS. 8A to 8I above are conducted, to fabricate the first wiring part 60. Besides, in this embodiment, the second wiring part 70 is fabricated in the same manner as the first wiring part 60. Then, as shown in FIG. 8J, the first wiring part 60 and the second wiring part 70 fabricated following the above-mentioned treatment procedure are adhered to each other. This adhering treatment is the same as the adhering treatment (FIG. 5G) described in the first embodiment above, and, therefore, description thereof is omitted here. Incidentally, though not shown in FIG. 8J, the oxygen gettering layer is left at the joint interface Sj upon adhesion of the first wiring part 60 and the second wiring part 70. Since the oxygen gettering layer is as very thin as several nanometers, however, the oxygen gettering layer appears as if absorbed in the Cu wiring joint part in the vicinity of the joint interface Sj upon joining, so that substantially no step is generated at the joint interface Sj.

In this embodiment, the semiconductor apparatus 2 is manufactured in the above-described manner. As above-mentioned, in the present embodiment, like in the first embodiment above, the gettering material 17a which reacts with oxygen more easily than hydrogen does is preliminarily diffused into the inside of each Cu wiring joint part and into the vicinity of the joint-side surface of the Cu wiring joint part, prior to the joining of the first wiring part 60 and the second wiring part 70. In this embodiment, therefore, the same effect as that of the first embodiment above can be obtained.

In addition, in the present embodiment, like in the second embodiment above, the possible diffusion region of the gettering material 17a is the Cu wiring joint part, which is smaller than the possible diffusion region of the gettering material 17a in the first embodiment above. In this embodiment, therefore, the same effect as that of the second embodiment above can be obtained.

In the present embodiment, furthermore, the oxygen gettering layer is provided on the join-side surface of the Cu wiring joint part, and the gettering material 17a is diffused into the Cu joint part. In this embodiment, therefore, the gettering material 17a can be diffused in a higher concentration in the vicinity of the Cu—Cu joint interface. As a result, in the present embodiment, oxygen remaining in the vicinity of the joint interface Sj can be trapped by the gettering material 17a more efficiently.

5. Fourth Embodiment

In a fourth embodiment, description will be made of an example wherein the semiconductor apparatus 2 in the third embodiment described referring to FIG. 7 above is manufactured by a technique different from the technique adopted in the third embodiment. In this embodiment, therefore, description of the configuration of the semiconductor apparatus 2 will be omitted, and only the manufacturing technique therefor will be described.

A technique of manufacturing the semiconductor apparatus 2 according to the present embodiment will be described referring to FIGS. 9A to 9I. In FIGS. 9A to 9I, only a Cu—Cu joining step in the semiconductor apparatus 2 according to this embodiment will be mainly described. Therefore, FIGS. 9A to 9I show a schematic section of the vicinity of a Cu—Cu joint interface. Besides, in this embodiment, a second wiring part 70 can be fabricated in the same manner as a first wiring part 60. Therefore, as for other treatments (FIGS. 9A to 9H) than an adhering treatment (FIG. 9I), only treatments of a first wiring part 60 will be described here, for simplification of description. Incidentally, the other steps in manufacturing the semiconductor apparatus 2 than the Cu—Cu joining step can be carried out in the same manner as in a method of manufacturing a semiconductor apparatus, for example, a solid-state imaging apparatus, according to a related art.

As is clear from comparison of FIGS. 9A to 9E with FIGS. 8A to 8E, the treatments ranging from the formation of a wiring structure part including a first $SiO_2$ layer 11, a first Cu barrier film 12 and a first Cu wiring body 13, and cleaning thereof, to the formation of a first Cu wiring joint part 18 are the same as those in the third embodiment above. Therefore, descriptions of the treatments shown in FIGS. 9A to 9E are omitted here.

Figure 9A:
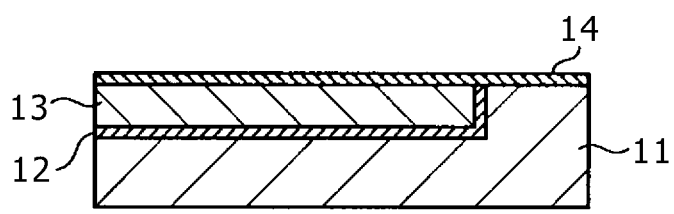
FIGS. 9A to 9I are views for illustrating the procedure of fabrication of a semiconductor apparatus according to a fourth embodiment of the present disclosure.
Figure 9B:
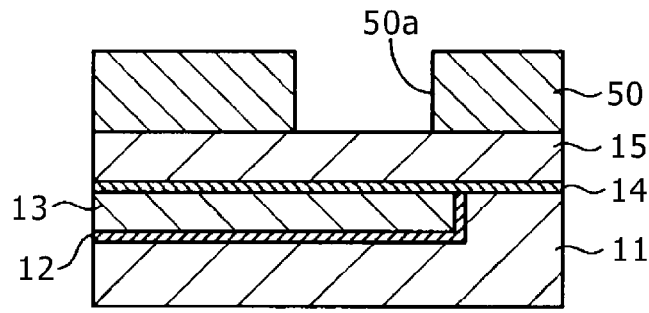
Figure 9C:
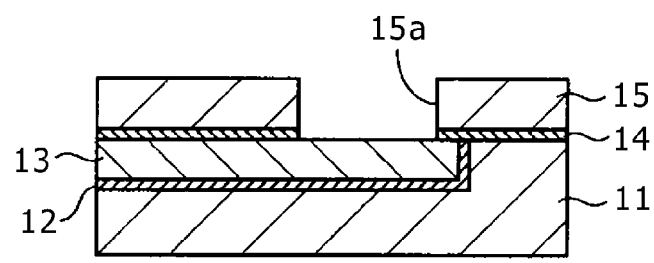
Figure 9D:
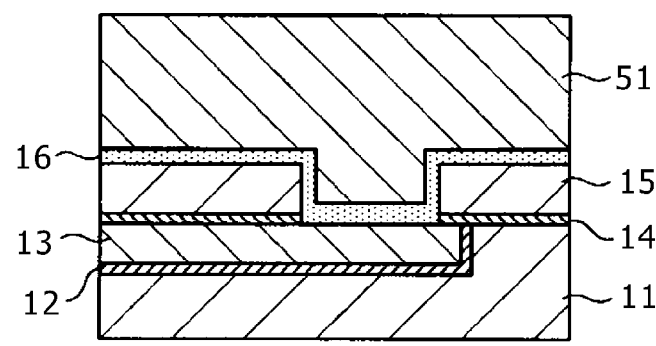
Figure 9E:
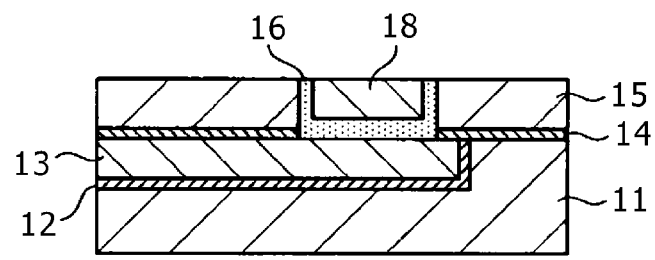
Figure 9F:
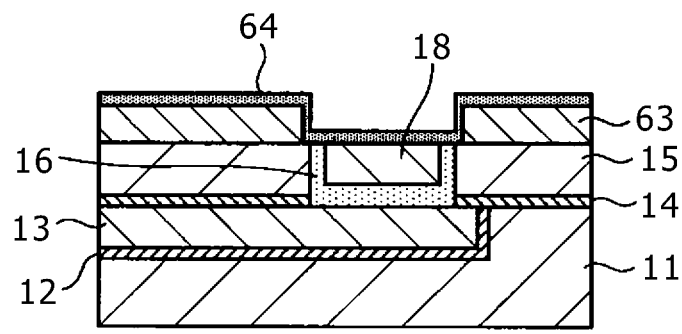

After the surface of the first Cu wiring joint part 18 is cleaned by a treatment shown in FIG. 9E, a resist 63 is formed on the surfaces of the first Cu wiring joint part 18 and a first interlayer dielectric 15. Thereafter, the resist 63 is subjected to a patterning treatment by use of a photolithographic technique. By this patterning, as shown in FIG. 9F, an opening part is formed in the formation region of the first Cu wiring joint part 18 and a first Cu barrier layer 16, and the resist 63 is left in the other regions. Subsequently, a first oxygen gettering layer 64 is formed in a thickness of about 1 to 50 nm on the first Cu barrier layer 16, the first Cu wiring joint part 18 and the resist 63, in the same manner as in the first embodiment above.

Figure 9G:
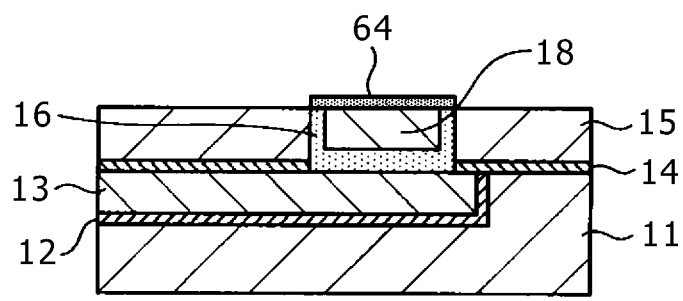

Next, the film formed member in which the first oxygen gettering layer 64 has been formed is subjected to a chemical liquid treatment (e.g., lift-off treatment or the like) by use of an organic solvent, such as NMP or thinner, and an ammonium fluoride solution. By this treatment, the resist 63 remaining on the first interlayer dielectric 15 and unnecessary portions of the first oxygen gettering layer 64 formed on the surface of the resist 63 are removed. Besides, in this instance, the residue deposited upon the etching treatment is completely removed by the chemical liquid treatment. Consequently, as shown in FIG. 9G, the first oxygen gettering layer 64 is left only on the formation regions of the first Cu wiring joint part 18 and the first Cu barrier layer 16.

Figure 9H:
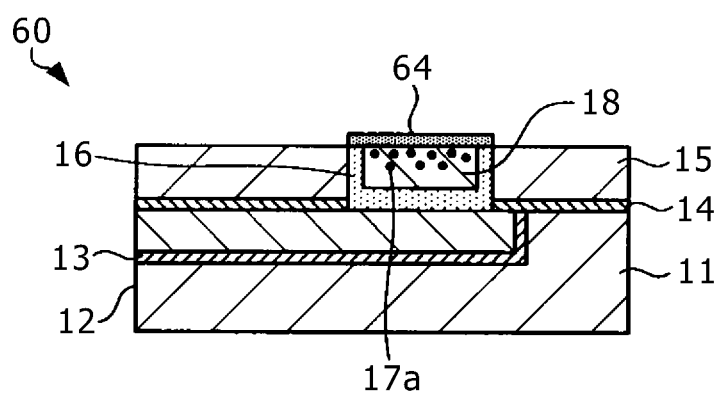

Subsequently, the film formed member with the first oxygen gettering layer 64 thus left is heated at about 100 to 400° C. for about one minute to two hours in, for example, a $N_2$ atmosphere at the atmospheric pressure or vacuum by use of a heating apparatus, for example, a hot plate or an RTA apparatus. By this heating treatment, as shown in FIG. 9H, the gettering material 17a contained in the first oxygen gettering layer 64 is diffused into the first Cu wiring joint part 18.

Figure 9I:
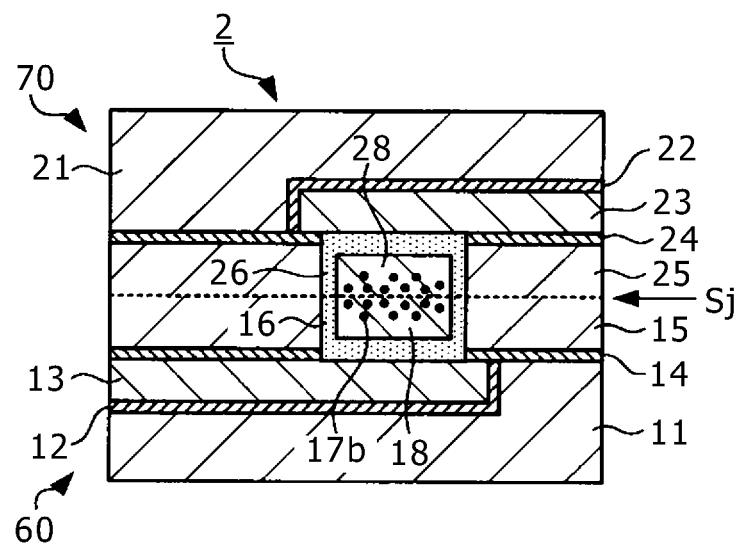

In the present embodiment, the treatments described referring to FIGS. 9A to 9H above are conducted, to fabricate the first wiring part 60. Besides, in this embodiment, the second wiring part 70 is fabricated in the same manner as the first wiring part 60. Then, as shown in FIG. 9I, the first wiring part 60 and the second wiring part 70 fabricated following the above-mentioned treatment procedure are adhered to each other, in the same manner as in the third embodiment (the first embodiment) above.

In the present embodiment, the semiconductor apparatus 2 is manufactured in the above-described manner. As above-mentioned, in this embodiment, like in the first embodiment above, the gettering material 17a which reacts with oxygen more easily than hydrogen does is preliminarily diffused into the inside of each Cu wiring joint part and into the vicinity of the joint-side surface of the Cu wiring joint part, prior to the joining of the first wiring part 60 and the second wiring part 70. In this embodiment, therefore, the same effect as that of the first embodiment above can be obtained.

In addition, in the present embodiment, like in the second embodiment above, the possible diffusion region of the gettering material 17a is the Cu wiring joint part, which is smaller than the possible diffusion region of the gettering material 17a in the first embodiment above. Therefore, in this embodiment, the same effect as that of the second embodiment above can be obtained.

Besides, in this embodiment, like in the third embodiment above, the gettering material 17a can be diffused into the vicinity of the Cu—Cu joint interface in a higher concentration. Therefore, in this embodiment, the same effect as that of the third embodiment above can be obtained.

Furthermore, in the present embodiment, in the treatment in transition from FIG. 9F to FIG. 9G, the resist 63 and unnecessary portions of the first oxygen gettering layer 64 are removed, not by an etching treatment but by the chemical liquid treatment (lift-off method) using an organic solvent or the like. In this embodiment, therefore, the semiconductor apparatus 2 can be manufactured more easily.

6. Various Modifications

Now, modifications of the Cu—Cu joining techniques and the semiconductor apparatuses according to the above-described embodiments will be described below.

[Modification 1]

Figure 10:
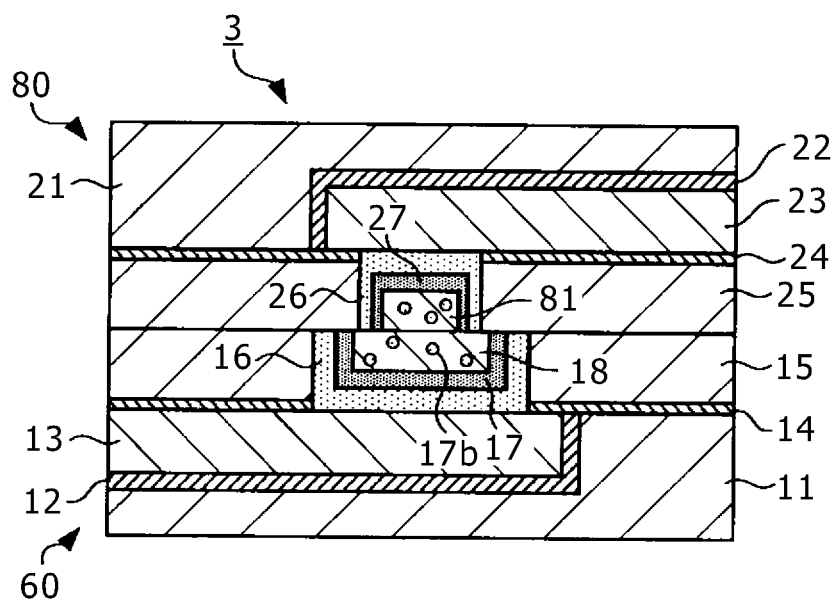
FIG. 10 is a schematic sectional view of the vicinity of a Cu—Cu joint interface in a semiconductor apparatus according to Modification 1.

While examples wherein the size of the joint surface of the first Cu wiring joint part 18 and the size of the joint surface of the second Cu wiring joint part 28 are the same have been described in the first to fourth embodiments above, the disclosure is not restricted to this configuration, and the sizes may be different. FIG. 10 illustrates an example (Modification 1) wherein the joint surface sizes are different. FIG. 10 is a schematic sectional view of the vicinity of a Cu—Cu joint interface in the semiconductor apparatus 3 according to Modification 1. Incidentally, in the semiconductor apparatus 3 shown in FIG. 10, the same configurations as those in the semiconductor apparatus 1 in the first and second embodiments described referring to FIG. 4 above are denoted by the same reference symbols as used above.

In the example shown in FIG. 10, the size of the joint surface of a second Cu wiring joint part 81 of a second wiring part 80 is set smaller than the size of the joint surface of a first Cu wiring joint part 18 of a first wiring part 10. Incidentally, the other configurations than the joint surface sizes are the same as the configurations in the first and second embodiments above. In such a configuration as this, also, oxygen remaining in the vicinity of a joint interface Sj can be trapped by the gettering material 17a diffused into the vicinity of the joint interface Sj, like in the first and second embodiments above. Therefore, in this embodiment, the same effects as those of the first and second embodiments above can be obtained.

Incidentally, while an example wherein the size of the joint surface of the second Cu wiring joint part 81 is set smaller than the size of the joint surface of the first Cu wiring joint part 18 has been shown in FIG. 10, this configuration is not restrictive of the present disclosure. For instance, the size of the joint surface of the second Cu wiring joint part 81 may be set greater than the size of the joint surface of the first Cu wiring joint part 18.

In addition, while an example wherein the size of the joint surface of the first Cu wiring joint part 18 and the size of the joint surface of the second Cu wiring joint part 28, in the semiconductor apparatus 1 (FIG. 4) in the first and second embodiments above, are set different from each other has been described referring to FIG. 10, this configuration is not restrictive of the present disclosure. For instance, the size of the joint surface of the first Cu wiring joint part 18 and the size of the second Cu wiring joint part 28, in the semiconductor apparatus 2 (FIG. 7) in the third and fourth embodiments above, may be set different from each other.

Furthermore, while examples wherein the first Cu wiring joint part 18 and the second Cu wiring joint part 28 of the same size are joined to each other without any positional error (mis-alignment) has been described in the first to fourth embodiments above, this configuration is not restrictive of the present disclosure. The positions in joining of the first Cu wiring joint part 18 and the second Cu wiring joint part 28 may be out of alignment, insofar the electrical connection between the joint parts is maintained.

[Modification 2]

In the semiconductor apparatus 2 (FIG. 7) according to the third and fourth embodiments above, description has been made of an example wherein the oxygen gettering layer formed on the surface of each Cu wiring joint part is so thin that no step is generated at the joint interface Sj. In the case where for example the oxygen gettering layer formed on the surface of each Cu wiring joint part is thick, however, a step may be generated at the joint interface Sj upon adhesion of the first wiring part 60 and the second wiring part 70 to each other. In such a case, therefore, in order to prevent generation of such a step at the joint interface Sj, the surface of each Cu wiring joint part may be removed further by an amount corresponding to the thickness of the oxygen gettering layer, followed by forming the oxygen gettering layer on the surface of the Cu wiring joint part.

Figure 11:
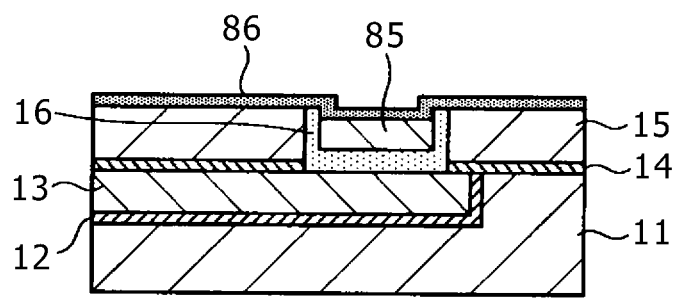
FIG. 11 is a view for illustrating the procedure of formation of an oxygen gettering layer in the semiconductor apparatus according to Modification 2.

FIG. 11 shows a schematic sectional view of a film formed member wherein a first oxygen gettering layer is formed on the surface of a first Cu wiring joint part by such a technique as just-mentioned. In the example illustrated in FIG. 11, in performing the treatment in the third embodiment shown in FIG. 8F, first, the surface of the first Cu wiring joint part 85 is removed further by an amount corresponding to the thickness of the first oxygen gettering layer 86 by, for example, an etching treatment or the like. This results in that the surface of the first Cu wiring joint part 85 is located on the first Cu wiring body 13 side relative to the surface of the first interlayer dielectric 15 (the first Cu barrier layer 16). Thereafter, the first oxygen gettering layer 86 is formed on the first Cu wiring joint part 85. This results in that, as shown in FIG. 11, the surface position of the first oxygen gettering layer 86 on the first Cu wiring joint part 85 and the surface position of the first interlayer dielectric 15 (the first Cu barrier layer 16) are the same.

Where each Cu wiring joint part is fabricated in such a technique as just-mentioned, an increase in the thickness of the oxygen gettering layer can be achieved, without generating a step at the joint interface Sj upon adhesion of the first wiring part 60 and the second wiring part 70.

Incidentally, while an example wherein the technique for fabricating the oxygen gettering layer in this example is applied to the technique of fabricating the semiconductor apparatus 2 in the third embodiment above has been shown in FIG. 11, this is not restrictive of the present disclosure. For instance, the technique of fabricating the oxygen gettering layer in this example may be applied to the technique of fabricating the semiconductor apparatus 2 according to the fourth embodiment above. Besides, in the present disclosure, for instance, in addition to the technique of fabricating the oxygen gettering layer according to this example, the configuration of Modification 1 above may be added to the third and fourth embodiments.

[Modification 3]

In the various embodiments above and the various modifications above, description has been made of an example wherein the oxygen gettering layer is formed in contact with the Cu wiring joint part and the film formed member is annealed to diffuse (disperse) the gettering material into the Cu wiring joint part. The present disclosure, however, is not restricted to this configuration. For instance, the gettering material may be diffused (dispersed) into the Cu wiring joint part by ion implantation.

In addition, for example where the Cu wiring joint part is formed by sputtering, the gettering material may be sputtered simultaneously with the formation of the Cu wiring joint part, thereby diffusing (dispersing) the gettering material into the Cu wiring joint part. It should be noted in this case, however, that an increase in the aspect ratio (depth) of the Cu wiring joint part may make it difficult for the gettering material to be incident on (appropriately supplied to) the inside of the Cu wiring joint part. Where the aspect ratio (depth) of the Cu wiring joint part is great, therefore, it is preferable to form the oxygen gettering layer in contact with the Cu wiring joint part, like in the above embodiments.

[Modification 4]

In the various embodiments above and the various modifications above, description has been made of an example wherein the gettering material is diffused into both the first Cu wiring joint part and the second Cu wiring joint part. This configuration, however, is not restrictive of the present disclosure. For instance, the gettering material may be diffused into only one of the first Cu wiring joint part and the second Cu wiring joint part, taking into account such conditions as the concentration of the gettering material diffused in the Cu wiring joint part and process limitations.

More specifically, for example in the semiconductor apparatus of Modification 2 shown in FIG. 11, taking into account the thickness of the first oxygen gettering layer 86, an etching treatment for locating the surface of the first Cu wiring joint part 85 on the first Cu wiring body 13 side relative to the surface of the first interlayer dielectric 15 is separately added. In such a case, for a reduction in the number of process steps (process limitations), the gettering material is preferably diffused into only one of the first Cu wiring joint part and the second Cu wiring joint part.

[Modification 5]

While an example wherein the wiring film is a Cu film has been described in the various embodiments and modifications above, this is not restrictive of the present disclosure. The problem of generation of voids at the joint interface Sj between the wiring films described referring to FIGS. 2A to 2D may be generated with an arbitrary metallic film, insofar as the wiring film is a metallic film having grain boundaries. Therefore, the Cu—Cu joining techniques described in the above embodiments and modifications can be used also in the cases where wiring films composed of metallic films having grain boundaries are to be joined to each other, whereby a similar effect can be obtained. Accordingly, the wiring films may each be composed of a film of, for example, Al, W, Ti, TiN, Ta, TaN, Ru or the like or a stacked film of such films.

[Modification 6]

While an example wherein the technique of joining two wiring films (Cu films) to each other is applied to a semiconductor apparatus has been described in the various embodiments and modifications above, this configuration is not restrictive of the present disclosure. For instance, the techniques for joining the wiring films (Cu films) to each other in the above embodiments and modifications can be applied also in the cases where two wiring films provided respectively on two substrates formed from other material than semiconductor are to be joined to each other, whereby a similar effect can be obtained.

7. Various Application Examples

The semiconductor apparatus and manufacturing technique therefor (Cu—Cu joining technique) described in any of the various embodiments and modifications above is applicable to various electronic devices in which adhesion of two substrates and a Cu—Cu joining treatment are needed at the time of manufacture thereof. Especially, the Cu—Cu joining technique in the above-described embodiments and modifications is suitable, for example, for manufacture of solid-state imaging apparatuses.

Application Example 1

Figure 12:
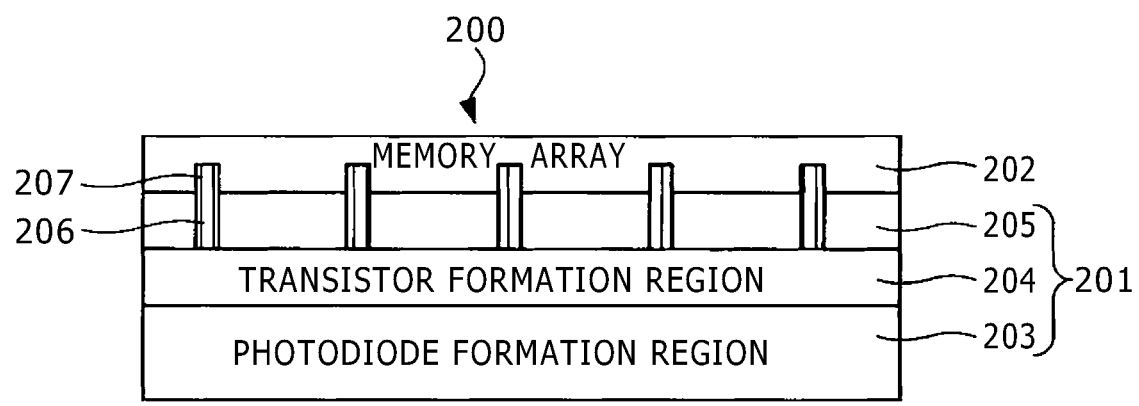
FIG. 12 illustrates a configuration example of a semiconductor apparatus according to Application Example 1 in which the Cu—Cu joining technique according to an embodiment of the present disclosure can be applied.

FIG. 12 shows a semiconductor image sensor module to which the semiconductor apparatus and manufacturing technique therefor described in any of the various embodiments and modifications above can be applied. The semiconductor image sensor module 200 shown in FIG. 12 has a configuration wherein a first semiconductor chip 201 and a second semiconductor chip 202 are joined to each other.

The first semiconductor chip 201 incorporates a photodiode formation region 203, a transistor formation region 204, and an analog-digital converter array 205. The photodiode formation region 203, the transistor formation region 204 and the analog-digital converter array 205 are stacked in this order.

In addition, the analog-digital converter array 205 is formed therein with through-contact parts 206. Each of the through-contact parts 206 is so formed that its one end portion is exposed to the surface on the second semiconductor chip 202 side of the analog-digital converter array 205.

On the other hand, the second semiconductor chip 202 has a memory array, and is formed therein with contact parts 207. Each of the contact parts 207 is so formed that its one end portion is exposed to the surface on the first semiconductor chip 201 side of the second semiconductor chip 202.

The through-contact parts 206 and the contact parts 207 are abutted on each other, and, in this condition, thermocompression bonding is conducted to join the first semiconductor chip 201 and the second semiconductor chip 202 to each other, thereby fabricating the semiconductor image sensor module 200. The semiconductor image sensor module 200 thus configured is advantageous in that the number of pixels per unit area can be increased and the thickness thereof can be reduced.

In the semiconductor image sensor module 200 in this example, the Cu—Cu joining technique in the various embodiments and modifications above can be applied, for example, to the step of joining the first semiconductor chip 201 and the second semiconductor chip 202 to each other. In this case, generation of voids at the joint interface between the first semiconductor chip 201 and the second semiconductor chip 202 can be prevented, whereby reliability of the semiconductor image sensor module 200 can be enhanced.

Application Example 2

Figure 13:
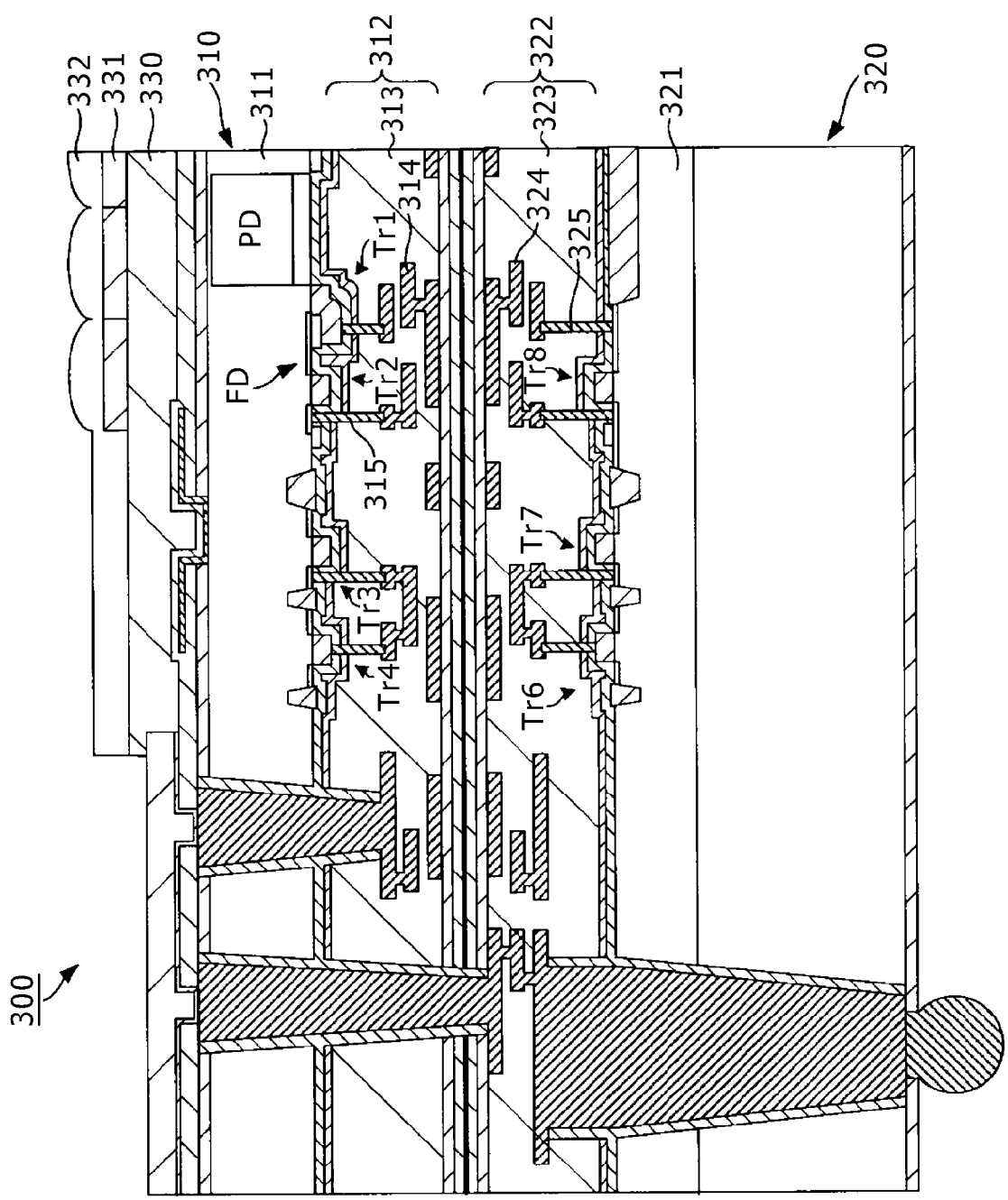
FIG. 13 illustrates a configuration example of a semiconductor apparatus according to Application Example 2 in which the Cu—Cu joining technique according to an embodiment of the present disclosure can be applied.

FIG. 13 shows a schematic sectional view of a major part of a back-side irradiation type solid-state imaging apparatus to which the semiconductor apparatus and manufacturing technique therefor described in any of the various embodiments and modifications above can be applied.

A solid-state imaging apparatus 300 shown in FIG. 13 has a configuration in which a first semiconductor substrate 310 provided with a pixel array in a semi-product state and a second semiconductor substrate 320 provided with a logic circuit in a semi-product state are joined to each other. Incidentally, in the solid-state imaging apparatus 300 shown in FIG. 13, a flattening film 330, an on-chip color filters 331 and on-chip microlenses 332 are stacked in this order on the surface, on the side opposite to the second semiconductor substrate 320 side, of the first semiconductor substrate 310.

The first semiconductor substrate 310 has a P-type semiconductor well region 311 and a multilayer wiring layer 312, and the semiconductor well region 311 is disposed on the flattening film 330 side. The semiconductor well region 311 is formed therein with, for example, photodiodes (PDs), floating diffusions (FDs), MOS (Metal Oxide Semiconductor) transistors (Tr1, Tr2) constituting pixels, and MOS transistors (Tr3, Tr4) constituting a control circuit. Besides, the multilayer wiring layer 312 is formed therein with a plurality of metal wirings 314 formed through an interlayer dielectric 313, and a connection conductors 315 formed in the interlayer dielectric 313 so as to each connect the metal wiring 314 and a corresponding MOS transistor to each other.

On the other hand, the second semiconductor substrate 320 includes, for example, a semiconductor well region 321 formed on a surface of a silicone substrate, and a multilayer wiring layer 322 formed on the first semiconductor substrate 310 side of the semiconductor well region 321. The semiconductor well region 321 is formed therein with MOS transistors (Tr6, Tr7, Tr8) constituting a logic circuit. In addition, the multilayer wiring layer 322 is formed therein with a plurality of metal wirings 324 formed through an interlayer dielectric 323, and connection conductors 325 formed in the interlayer dielectric 323 so as to each connect the metal wiring 324 and a corresponding MOS transistor to each other.

The Cu—Cu joining techniques according to the various embodiments and modifications above can be applied also to the back-side irradiation type solid-state imaging apparatus 300 configured as above-mentioned.

Application Example 3

A solid-state imaging apparatus to which the Cu—Cu joining technique according to any of the various embodiments and modifications above is applied can be applied to electronic apparatuses, for example, camera systems such as digital cameras, video cameras, etc., cellphones having an imaging function, or other apparatuses having an imaging function. In Application Example 3, description will be made by taking a camera as a configuration example of electronic apparatus.

Figure 14:
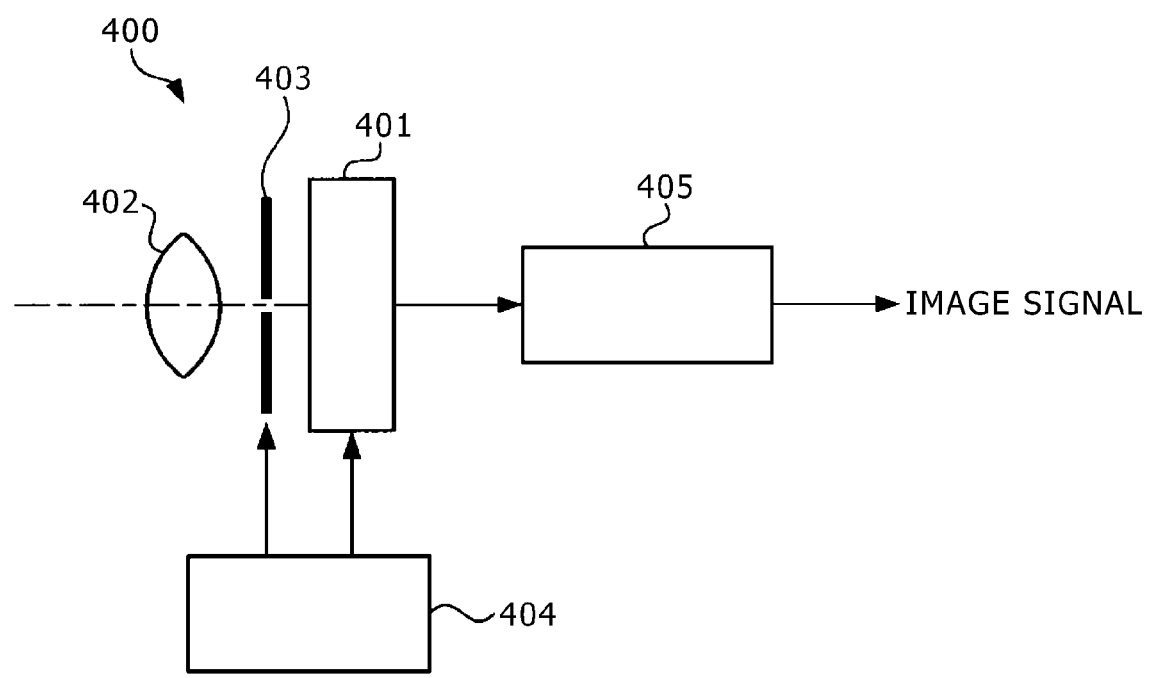
FIG. 14 illustrates a configuration example of an electronic apparatus according to Application Example 3 in which the Cu—Cu joining technique according to an embodiment of the present disclosure can be applied.
Figure 15A:
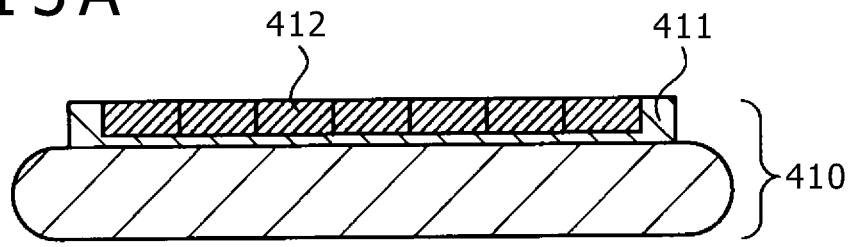
FIGS. 15A to 15D illustrate the procedure of a technique for manufacturing a solid-state imaging apparatus according to a related art.
Figure 15B:
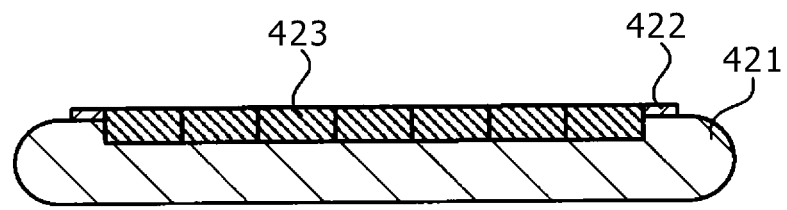
Figure 15C:
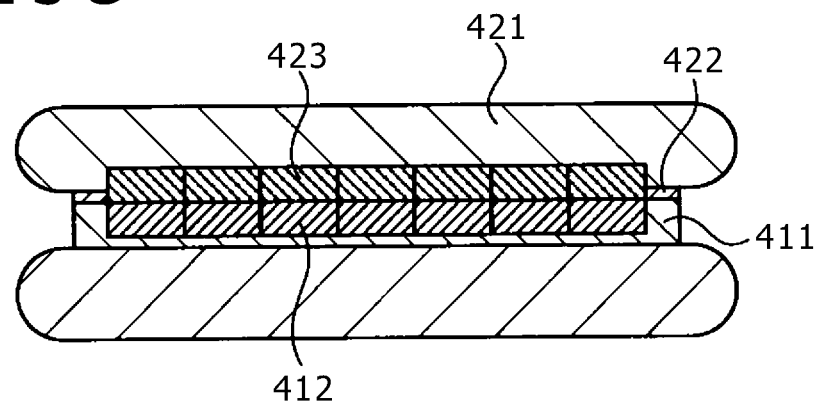
Figure 15D:
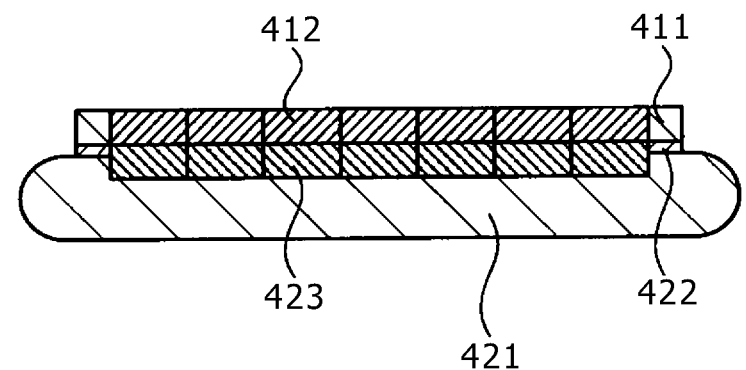
Figure 16A:
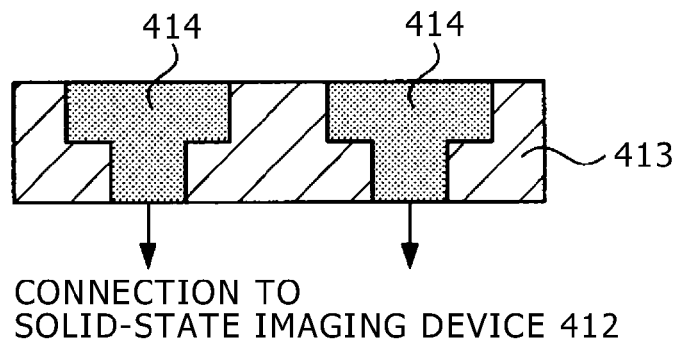
FIGS. 16A to 16C illustrate a Cu—Cu joining technique according to a related art.
Figure 16B:
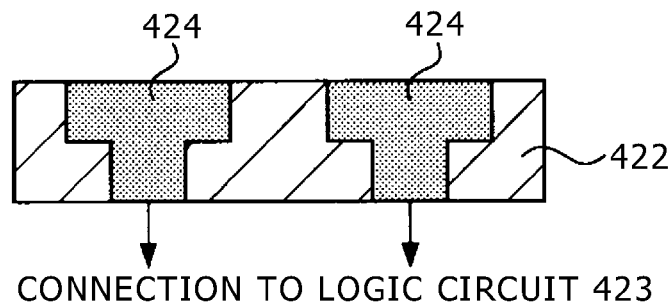
Figure 16C:
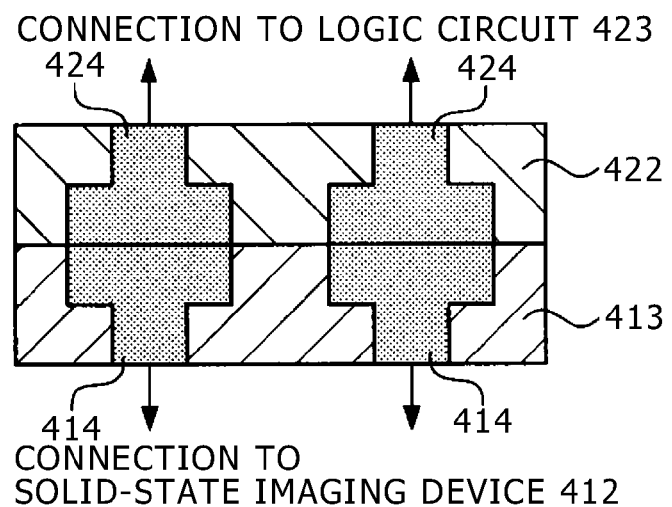

FIG. 14 shows a schematic configuration of a camera according to Application Example 3. Incidentally, FIG. 14 shows a configuration example of a video camera capable of picking up still images or video images.

The camera 400 in this example includes a solid-state imaging apparatus 401, an optical system 402 for guiding incident light to a light-receiving sensor part of the solid-state imaging apparatus 401, a shutter device 403 provided between the solid-state imaging apparatus 401 and the optical system 402, and a driving circuit 404 for driving the solid-state imaging apparatus 401. Furthermore, the camera 400 has a signal processing circuit 405 for processing an output signal from the solid-state imaging apparatus 401.

The solid-state imaging apparatus 401 is fabricated by use of the Cu—Cu joining technique according to one of the various embodiments and modifications above pertaining to the present disclosure. The configurations and functions of the other components are as follows.

The optical system (optical lens) 402 guides subject light (incident light) coming from a subject so as to form an image of the subject on an imaging plane (not shown) of the solid-state imaging apparatus 401. As a result, signal charges are stored in the solid-state imaging apparatus 401 for a predetermined period of time. Incidentally, the optical system 402 may be composed of an optical lens group including a plurality of optical lenses. In addition, the shutter device 403 controls a light irradiation period and a light blocking period, relating to the passage of the incident light to the solid-state imaging apparatus 401.

The driving circuit 404 supplies driving signals to the solid-state imaging apparatus 401 and the shutter device 403. The driving circuit 404, by the driving signals it supplies, controls a signal outputting operation for the signal processing circuit 405 of the solid-state imaging apparatus 401 and a shutter operation of the shutter device 403. Thus, in this example, by the driving signals (timing signals) supplied from the driving circuit 404, transmission of a signal from the solid-state imaging apparatus 401 to the signal processing circuit 405 is performed.

The signal processing circuit 405 applies various signal processing operations to the signal transmitted from the solid-state imaging apparatus 401. Then, the signal (image signal) obtained through various signal processing operations is stored in a storage medium (not shown) such as a memory, or is outputted to a monitor (not shown).

Incidentally, the present disclosure may assume the following configurations.

(1)

A semiconductor apparatus including:

a first semiconductor part including a first wiring;

a second semiconductor part which is adhered to the first semiconductor part and which includes a second wiring electrically connected to the first wiring; and a metallic oxide formed by a reaction between oxygen and a metallic material which reacts with oxygen more easily than hydrogen does, the metallic oxide having been diffused into a region which includes a joint interface between the first wiring and the second wiring and the inside of at least one of the first wiring and the second wiring.

(2)

The semiconductor apparatus according to the above paragraph (1), wherein an energy of formation necessary for formation of the metallic oxide through the reaction between the metallic material and the oxygen is lower than an energy of formation necessary for formation of water through a reaction between the hydrogen and the oxygen.

(3)

The semiconductor apparatus according to the above paragraph (2), wherein the metallic material is at least one metallic material selected from the group including Fe, Mn, V, Cr, Mg, Si, Ce, Ti and Al.

(4)

The semiconductor apparatus according to the above paragraphs (1) to (3), wherein the first wiring and the second wiring are each a Cu wiring.

(5)

The semiconductor apparatus according to the above paragraphs (1) to (4), further including an oxygen gettering layer which is formed in contact with at least one of the first wiring and the second wiring and which contains the metallic material.

(6)

The semiconductor apparatus according to the above paragraph (5), wherein the oxygen gettering layer is provided at the joint interface between the first wiring and the second wiring.

(7)

An electronic device including:

a first wiring part including a first wiring;

a second wiring part which is in the state of being adhered to the first wiring part and which includes a second wiring electrically connected to the first wiring; and a metallic oxide formed by a reaction between oxygen and a metallic material which reacts with oxygen more easily than hydrogen does, the metallic oxide having been diffused into a region which includes a joint interface between the first wiring and the second wiring and the inside of at least one of the first wiring and the second wiring.

(8)

A method of manufacturing a semiconductor apparatus which has a first semiconductor part including a first wiring and a second semiconductor part including a second wiring, the method including:

diffusing a metallic material which reacts with oxygen more easily than hydrogen does, into the inside of at least one of the first wiring and the second wiring;

adhering the first semiconductor part and the second semiconductor part to each other so that the first wiring and the second wiring are electrically connected to each other; and heating the first semiconductor part and the second semiconductor part, in the adhered state, so as to cause the metallic material and the oxygen to react with each other.

It should be understood by those skilled in the art that various modifications, combinations, sub-combinations and alternations may occur depending on design requirements and other factors insofar as they are within the scope of the appended claims or the equivalent thereof.

What is claimed is:

1. A semiconductor apparatus comprising:
  a first semiconductor part including a first wiring;
  a second semiconductor part which is adhered to the first semiconductor part and which includes a second wiring electrically connected to the first wiring; and
  a metallic oxide formed in at least one of the first wiring and the second wiring.

2. The semiconductor apparatus according to claim 1, wherein a formation energy provided for formation of the metallic oxide through a reaction between a metallic material to be oxidized and oxygen is lower than an energy of formation necessary for formation of water through a reaction between hydrogen and oxygen.

3. The semiconductor apparatus according to claim 2, wherein the metallic material is at least one metallic material selected from the group including Fe, Mn, V, Cr, Mg, Si, Ce, Ti and Al.

4. The semiconductor apparatus according to claim 1, wherein the first wiring and the second wiring are each a Cu wiring.

5. The semiconductor apparatus according to claim 1, further comprising
  an oxygen gettering layer which is formed in contact with at least one of the first wiring and the second wiring and which contains the metallic material.

6. The semiconductor apparatus according to claim 5, wherein the oxygen gettering layer is provided at a joint interface between the first wiring and the second wiring.

7. An electronic device comprising:
  a signal processing circuit configured to process an output signal from a solid-state imaging apparatus, the solid state imaging apparatus comprising:
  a first semiconductor part including a first wiring;
  a second semiconductor part which is adhered to the first semiconductor part and which includes a second wiring electrically connected to the first wiring; and
  a metallic oxide formed in at least one of the first wiring and the second wiring.

8. The electronic device according to claim 7, wherein energy of formation provided for formation of the metallic oxide through a reaction between a metallic material to be oxidized and oxygen is lower than an energy of formation necessary for formation of water through a reaction between hydrogen and oxygen.

9. The electronic device according to claim 8, wherein the metallic material is at least one metallic material selected from the group including Fe, Mn, V, Cr, Mg, Si, Ce, Ti and Al.

10. The electronic device according to claim 7, wherein the first wiring and the second wiring are each a Cu wiring.

11. The electronic device according to claim 7, further comprising:
  an oxygen gettering layer which is formed in contact with at least one of the first wiring and the second wiring and which contains the metallic material.

12. The electronic device according to claim 11, wherein the oxygen gettering layer is provided at a joint interface between the first wiring and the second wiring.

13. A method of manufacturing a semiconductor apparatus, the method comprising:
  forming a first semiconductor part including a first wiring;
  adhering a second semiconductor part to the first semiconductor part, the second semiconductor part including a second wiring electrically connected to the first wiring; and
  forming a metallic oxide in at least one of the first wiring and the second wiring.

14. The method according to claim 13, wherein a formation energy provided for formation of the metallic oxide through a reaction between a metallic material to be oxidized and oxygen is lower than an energy of formation necessary for formation of water through a reaction between hydrogen and oxygen.

15. The method according to claim 14, wherein the metallic material is at least one metallic material selected from the group including Fe, Mn, V, Cr, Mg, Si, Ce, Ti and Al.

16. The method according to claim 13, wherein the first wiring and the second wiring are each a Cu wiring.

17. The method according to claim 13, further comprising:
  an oxygen gettering layer which is formed in contact with at least one of the first wiring and the second wiring and which contains the metallic material.

18. The method according to claim 17, wherein the oxygen gettering layer is provided at a joint interface between the first wiring and the second wiring.

* * * * *